United States Patent
Ishii et al.

(10) Patent No.: US 7,078,762 B2
(45) Date of Patent: Jul. 18, 2006

(54) SEMICONDUCTOR MEMORY DEVICE AND METHOD FOR PRODUCING THE SAME

(75) Inventors: Tomoyuki Ishii, Tokyo (JP); Taro Osabe, Tokyo (JP); Hideaki Kurata, Tokyo (JP); Takeshi Sakata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 23 days.

(21) Appl. No.: 10/883,738

(22) Filed: Jul. 6, 2004

(65) Prior Publication Data

US 2005/0029681 A1 Feb. 10, 2005

(30) Foreign Application Priority Data

Aug. 4, 2003 (JP) .............................. 2003-205695

(51) Int. Cl.
*H01L 29/788* (2006.01)

(52) U.S. Cl. ...................................... 257/316; 438/257

(58) Field of Classification Search ........ 257/314–316, 257/319, 320; 438/257, 593
See application file for complete search history.

(56) References Cited

U.S. PATENT DOCUMENTS

| 6,627,927 B1 * | 9/2003 | Wu ............................ 257/213 |
| 2003/0008488 A1 | 1/2003 | Iijima |
| 2003/0155607 A1 | 8/2003 | Kamigaki et al. |

FOREIGN PATENT DOCUMENTS

| JP | 2001-156275 | 3/2000 |
| JP | 2001-326288 | 8/2000 |

* cited by examiner

*Primary Examiner*—David Vu
(74) *Attorney, Agent, or Firm*—Reed Smith LLP; Stanley P. Fisher, Esq.; Juan Carlos A. Marques, Esq.

(57) ABSTRACT

Disclosed is a non-volatile semiconductor memory device that uses a inversion layer provided on a semiconductor substrate as a data line. The memory device can reduce variation of characteristics among memory cells and can reduce bit cost. A plurality of assist gates are formed in the upper part of a p-type well through a gate oxide film. In the upper part of an interlayer insulator that covers those assist gates are formed word lines that are used as control electrodes. The width of those word lines is, for example, 0.1 μm, and each word line is separated from its adjacent word lines by a side wall spacer that is a silicon oxide film having a thickness of about 20 nm.

9 Claims, 29 Drawing Sheets

FIG. 9

|  | PROGRAM WORD LINE VOLTAGE | THRESHOLD VOLTAGE (Vth) RANGE |
|---|---|---|
| "01" | Vww3 | Vth>V3 |
| "00" | Vww2 | V2L<Vth<V2H |
| "10" | Vww1 | V1L<Vth<V1H |
| "11" | Vww0 | V0L<Vth<V0H |

SEMICONDUCTOR MEMORY DEVICE AND METHOD FOR PRODUCING THE SAME

CLAIM OF PRIORITY

The present application claims priority from Japanese application JP 2003-205695 filed on Aug. 4, 2003, the contents of which are hereby incorporated by reference as if set forth in the entirety herein.

FIELD OF THE INVENTION

The present invention relates to a semiconductor memory device and a method for producing the same, and more particularly, to a technique applied to non-volatile semiconductor memory devices, each of which uses a inversion layer formed on its semiconductor substrate as a data line.

BACKGROUND OF THE INVENTION

Recently, non-volatile semiconductor flash memories have come into wide use as data storage memories with excellent portability. The per-bit price of those flash memories has been rapidly dropping just from their miniaturization. This per-bit price reduction has actually been achieved by the element structure improvement or employment of multi-bit storage systems with respect to those flash memories.

Typical methods for forming memory arrays of large capacity flash memories used for files are NAND type and AND type. In the NAND type memory, memory cells are connected serially. In the AND type memory, memory cells are connected in parallel. The AND type memory in which memory cells are disposed in parallel is usually considered to be suitable for multi-bit storage operations, since it enables controlling of the number of electrons stored in a floating gate. Additionally, the AND type memory employs a hot electron writing method, so that its writing is fast. The NAND type is disclosed in "IEEE International Electron Devices Meeting" (pp.775–778, 2000) by F. Arai et al., while the AND type is disclosed in "IEEE International Electron Devices Meeting (pp.29–32, 2001)" by T. Kobayashi et al.

The official gazette of JP-A 156275/2001 illustrates a non-volatile memory technique that achieves both requirements of an array configuration in which memory cells are connected in parallel and a small memory cell region. This gazette further illustrates how to use each inversion layer formed on a semiconductor substrate located under an assist gate as a line. Also illustrated by the official gazette of JP-A No.2001-326288 is a technique for configuring a memory cell array at narrow word line pitches to achieve high density disposition of memory cells.

As described above, the AND type flash memory, which employs the hot electron writing technique, is fast in writing. Because the hot electron writing method employs source side injection, the method is also considered to be suitable for simultaneous writing in many memory cells. Additionally, because memory cells in an array are connected in parallel, each memory cell is not affected by the information stored in other adjacent memory cells so easily. This is why the AND type flash memory is also considered to be suitable for multi-bit storage per cell.

In spite of such advantages, the AND type flash memory continues to present difficulties. Because the AND type flash memory has an array structure in which diffusion layers are disposed in parallel, it is difficult to reduce the line pitches that are parallel to data lines due to the spread of the diffusion layers or existence of isolation regions. To solve this problem, a method for using inversion layers formed under the electrodes disposed in parallel to the data lines as local data lines may enable the subject AND type flash memory to operate without diffusion layers to be formed by impurity injection. This method is illustrated in the official gazette of JP-A No. 156275/2001.

However, each inversion layer usually has a resistance higher than that of the diffusion layer formed by means of high density impurity injection into the object semiconductor substrate. This is why the local data line resistance is different among places in the memory array, so that as the voltage falls, the potential to be applied to each target memory cell changes and the writing characteristic differs among memory cells significantly. This problem is accentuated as local data lines become longer. Another problem to arise from the employment of the above described memory structure is that if the flash memory is structured so that local data lines are connected to a global data line at a short distance through a switch simply, the number of memory cells per local data line is reduced and the area penalty of a selected transistor portion increases.

SUMMARY OF THE INVENTION

Under such circumstances, the present invention provides a technique for achieving the reduction of the variation of writing characteristics among memory cells, which depends on the place of each target memory cell in a memory cell array, and the reduction of the low bit cost in a non-volatile semiconductor memory device that uses inversion layers formed in the semiconductor substrate as data lines.

The present invention provides a technique for further miniaturizing memory cells in a semiconductor memory device that uses inversion layers formed in the semiconductor substrate as data lines.

The novel features of the present invention will become more apparent from the description of this specification and the accompanying drawings. Typical aspects of those to be disclosed in this specification will be described briefly as follows.

In an embodiment of the present invention, the semiconductor memory device may include a plurality of assist gates formed on a main surface of a first conductor type semiconductor substrate through a first insulator and extended in a first direction of the main surface. Also included may be a plurality of word lines formed on the plurality of assist gates through a second insulator and extended in a second direction that crosses the first direction, as well as a plurality of memory cells disposed at nodes of the plurality of assist gates and the plurality of word lines. The semiconductor memory device may employ a memory array structure in which a second conductor type inversion layer formed electrically on the surface of the semiconductor substrate located under the plurality of assist gates may be used as a line for connecting each of the plurality of memory cells to another. The plurality of word lines may be separated electrically from each another through a side wall spacer that may be an insulator formed at the side wall of each of even-numbered or odd-numbered word lines, and the space between adjacent word lines may be determined to be ½ of the width of the word lines, thereby each local data line may be reduced in length without decreasing the number of memory cells per local data line.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts, and wherein:

FIG. 9 is a table on correspondence among multi-bit information, writing word lines and threshold values used for the semiconductor memory device;

DETAILED DESCRIPTION

It is to be understood that the figures and descriptions of the present invention have been simplified to illustrate elements that are relevant for a clear understanding of the present invention, while eliminating, for the purpose of clarity, many other elements found in typical turf and soil management systems and methods of using the same. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Figure 1:
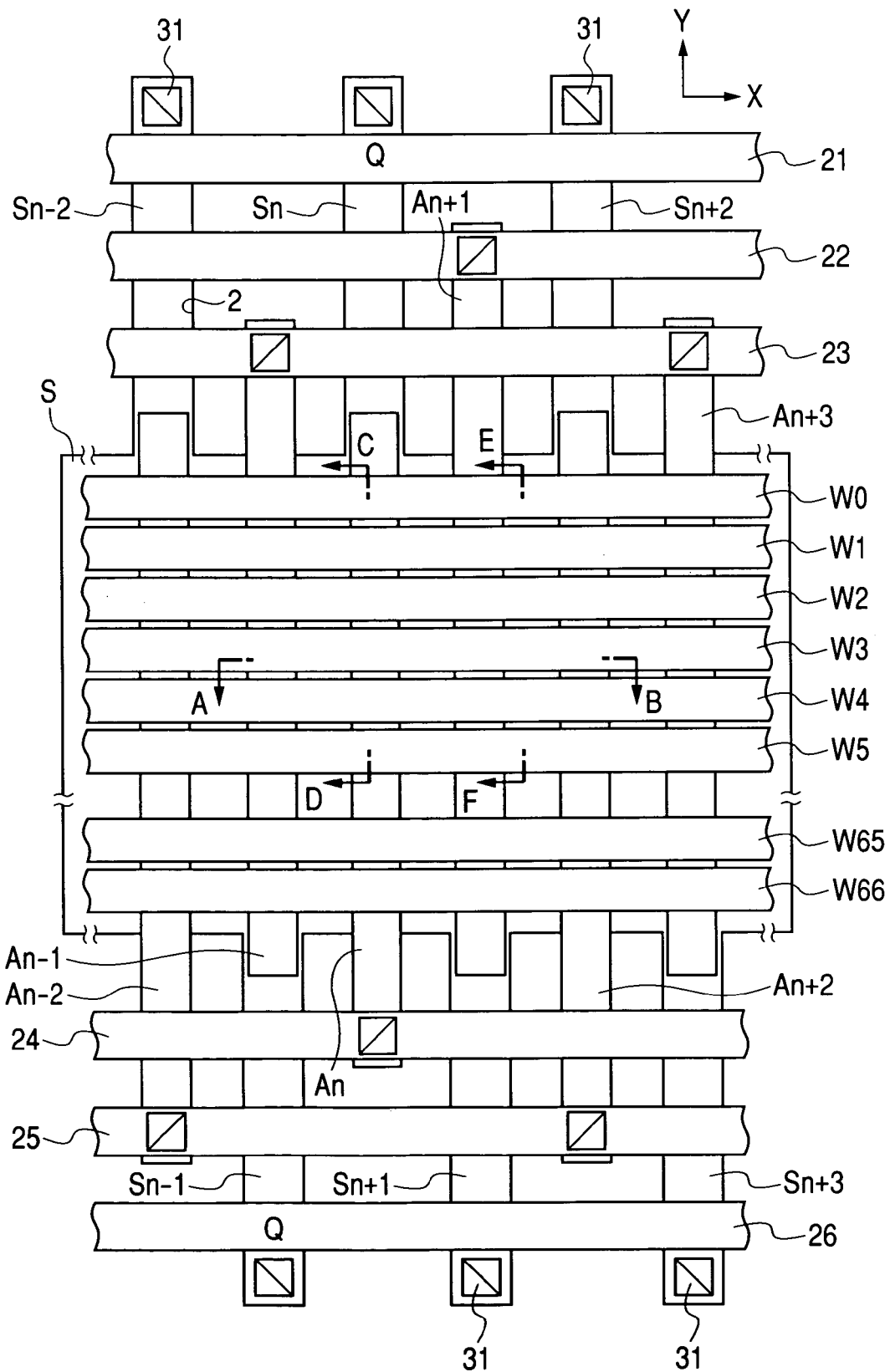
FIG. 1 is a schematic top view of a major portion of a memory cell array of a semiconductor memory device.
Figure 2:
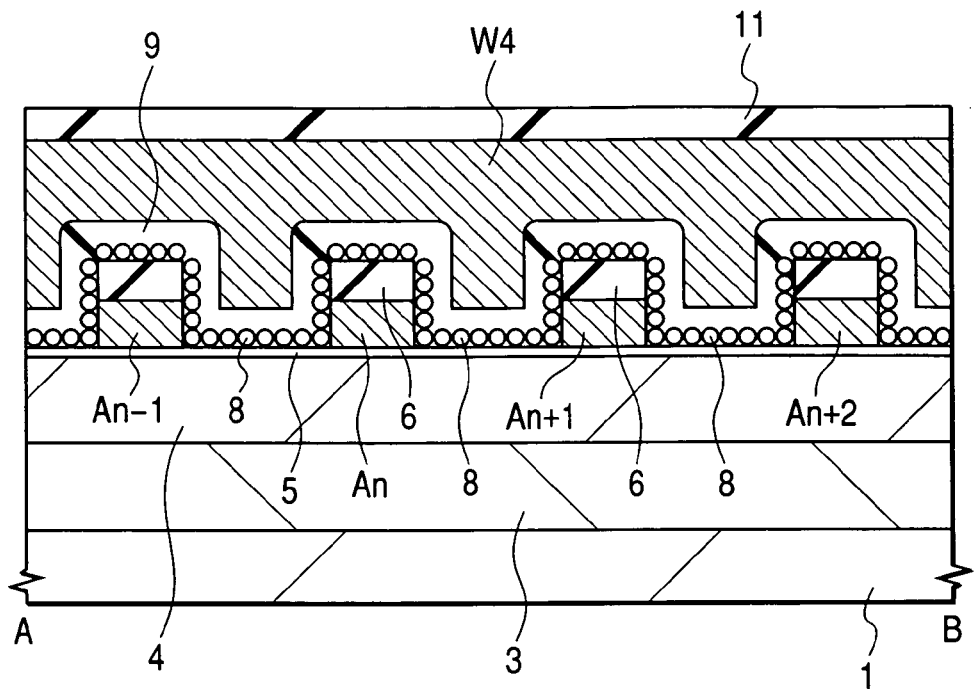
FIG. 2 is a cross sectional view of a semiconductor substrate along an A-B line in FIG. 1.
Figure 3:
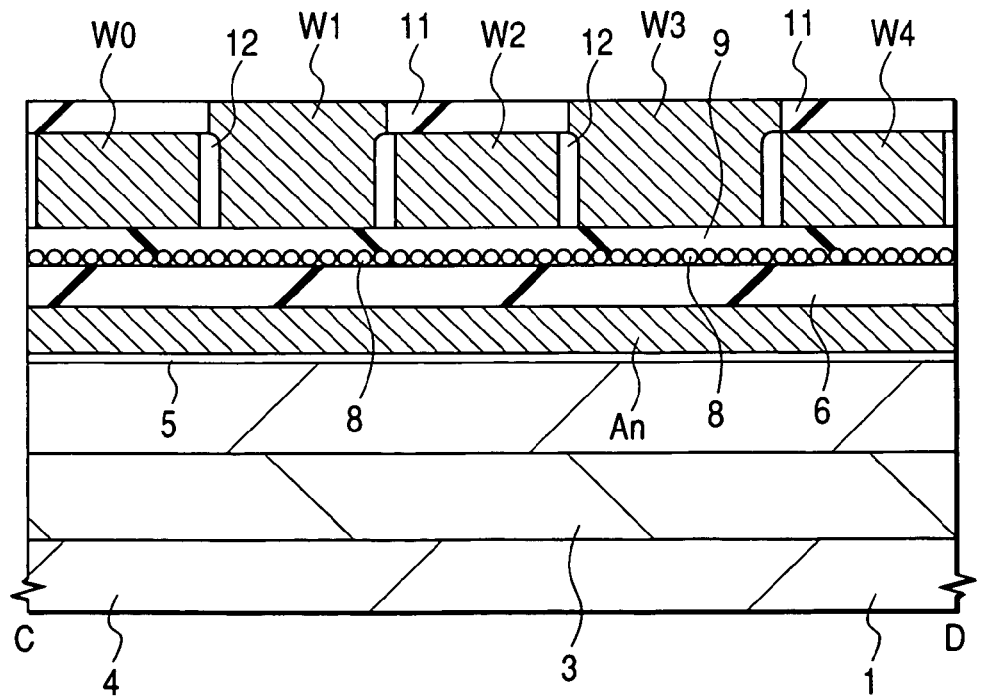
FIG. 3 is another cross sectional view of the semiconductor substrate along a C-D line (cross sectional direction of word lines) in FIG. 1.
Figure 4:
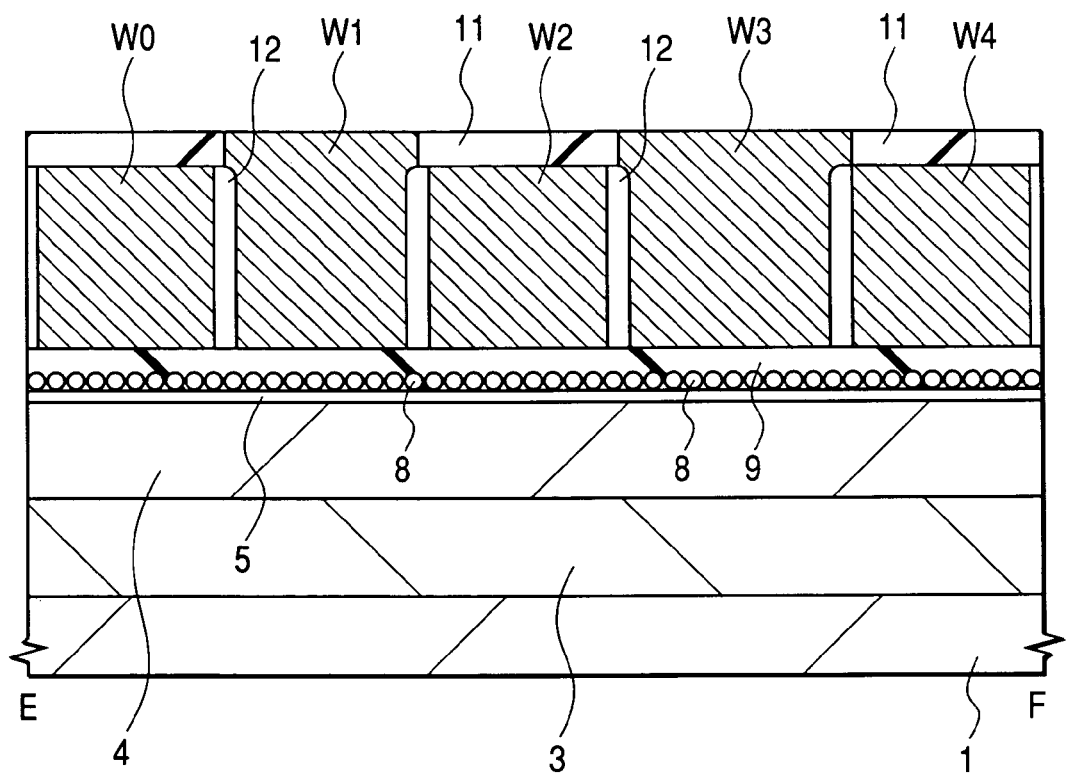
FIG. 4 is still another cross sectional view of the semiconductor substrate along an E-F line (cross sectional direction of assist gates) in FIG. 1.
Figure 5:
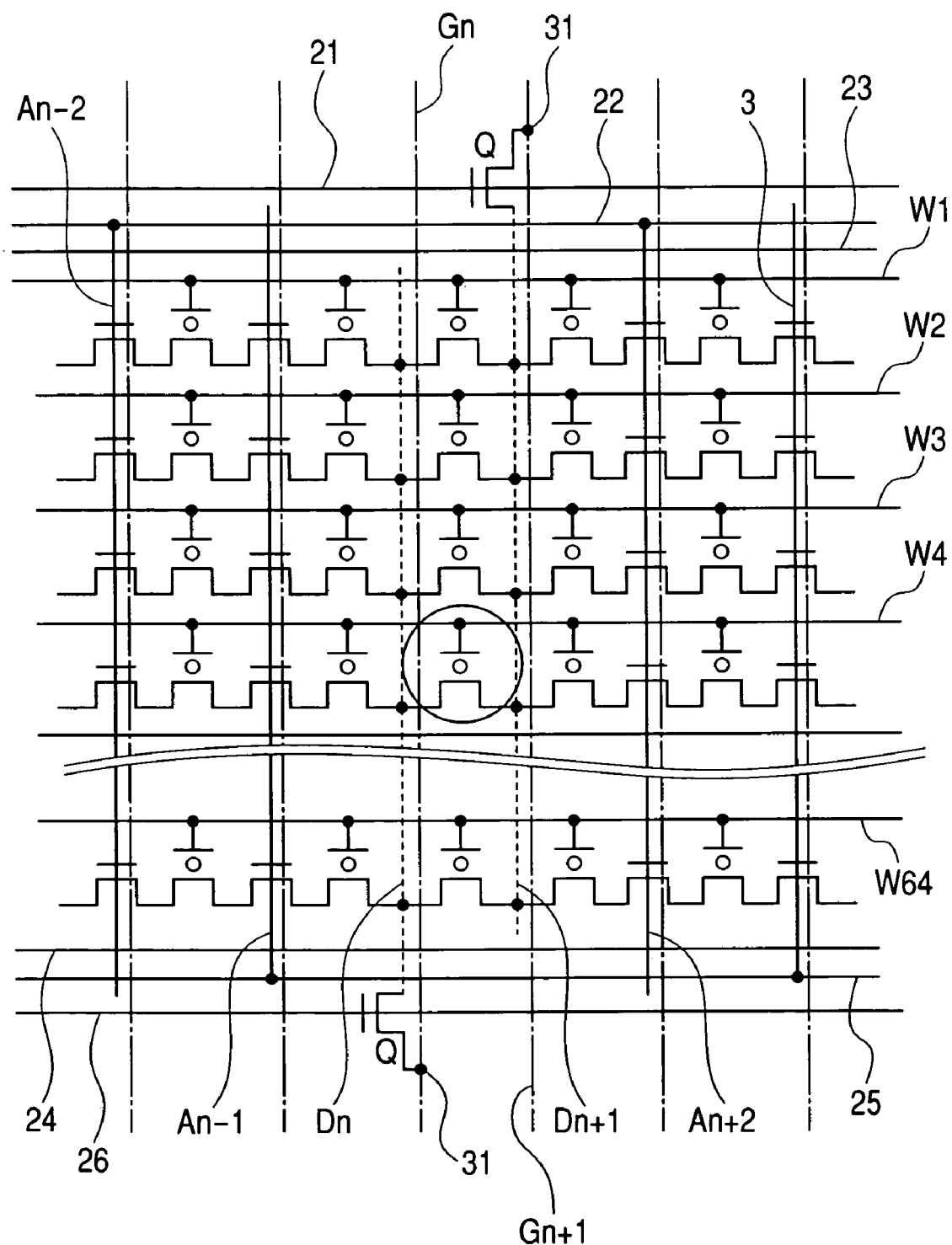
FIG. 5 is a circuit diagram of an equivalent circuit of the semiconductor memory device.

One embodiment of the present invention may be illustrated in FIGS. 1–5. FIG. 1 is a schematic top view of a major portion of a semiconductor substrate for describing a memory array of a flash memory. FIG. 2 is a cross sectional view of the semiconductor substrate along an A-B line (cross sectional direction of assist gates) shown in FIG. 1. FIG. 3 is another cross sectional view of the semiconductor substrate along a C-D line (cross sectional direction of word lines) shown in FIG. 1. FIG. 4 is still another cross sectional view of the semiconductor substrate along an E-F line (cross sectional direction of assist gates) shown in FIG. 1. FIG. 5 is a circuit diagram of an equivalent circuit of the memory array. In those drawings, metallic wiring, etc. except for necessary portions for the description are omitted.

An n-type well 3 may be formed in a semiconductor substrate (hereinafter, also termed a substrate) 1 made of p-type single-crystal silicon, and a p-type well 4 may be formed inside the n-type well 3 (3-layer well structure). As shown in FIG. 1, the flash memory in this first embodiment might not have an isolation region on the substrate 1 of the memory cell array. The flash memory might not have a MISFET diffusion layer (source and drain), which is usually formed usually by means of high density impurity injection.

In the upper part of the p-type well 4 may be formed a plurality of assist gates A (An−2, An−1, . . . , An+2, and An+3) through a gate oxide film (tunnel insulator) having a thickness of about 7 nm. Those assist gates A may be used to control the potential of the surface of the substrate 1. The assist gates A may be made of, for example, an n-type polycrystalline silicon film. In the upper part of each of the assist gates A may be formed a cap insulator 6 made of a silicon oxide film and in the upper part of the insulator 6 may be formed an interlayer insulator 9 having a thickness of about 15 nm.

Word lines W (W0 to W66) that are also used as control electrodes may be formed in the upper part of the interlayer insulator 9. Those word lines W may be made of, for example, an n-type polycrystalline silicon film and extended in a direction orthogonal to the extending direction of the assist gates A.

The width of each word line W may be, for example, 0.1 μm, and each word line may be separated from its adjacent word lines by a side wall spacer 12 made of a silicon oxide film having a thickness of about 20 nm. In other words, in any of the conventional flash memories, the space between word lines W may be about the width (gate length) of the word line W itself. In the flash memory in this exemplary embodiment, however, the space between word lines W may be ½ of the width (gate length) of the word line W and under.

At the bottom of the interlayer insulator 9 that separates the assist gates A from the word lines W may be provided charge storage regions formed by silicon microcrystal grains 8 having an average diameter of 10 nm. The charge storage regions may be diffused densely without coming into contact with each another. Electrons may be injected into those microcrystal grains 8 to store information in the flash memory.

Referring to FIG. 1, a memory array may be basically structured so as to dispose, for example, 67 word lines W (W0 to W66) in the Y direction. (Hereinafter, such a memory array will be referred to as a memory mat.) The 64 word lines (W1 to W64) of those word lines W may be effective and the rest word lines W0, W65, and W66 located at both ends of the Y direction of the memory mat may be dummy word lines that do not function as actual word lines W. Generally, the word lines located at both ends of a memory mat may be shifted in size significantly in a treating process, and thus the writing characteristics to be varied among memory cells in the memory mat may be reduced by avoiding the use of those word lines as memory cells. The total number of word lines per memory mat including the dummy ones may be an odd number to allow for treating, as will be described herein below.

Four adjacent assist gates A (for example, An−2, An+1, An, and An+1) may be collected into a group, and such groups may be disposed repetitively in the X direction in FIG. 1. Also, an independent voltage may be applied to each group of assist gates through control lines 22, 23, 24, and 25 extended in parallel to the word lines W. This means that the same voltage may be applied to the assist gates (ex., A4, A8, A12, A16, . . . ), among which the remainder obtained by dividing n by 4 may be equal. The number of assist gates A may be, for example, 16904 (A0 to A16903) disposed in a 2048-byte region that includes a 512-byte management region and four dummys disposed at each end of the Y direction.

On the substrate 1 at both ends of the Y direction of the memory mat may be formed a plurality of active regions S ( . . . , Sn−2, Sn−1, Sn, Sn+1, Sn+2, Sn+3, . . . ) with an isolation region between them, respectively.

A memory cell array may include 512 memory mats configured as described above, for example, in the Y direction.

The flash memory in this embodiment may use n-type inversion layers formed on the surface of the p-type well 4 when a positive voltage is applied to the object assist gate A as a local data line D (see FIG. 5). Generally, this type of inversion layer may have a resistance higher than that of the diffusion layer formed by means of high density impurity injection, so that the voltage to be applied to memory cells may differ among places of those memory cells in the memory mat during an operation. The writing characteristic thus comes to be easily varied among memory cells.

However, the flash memory in this exemplary embodiment may enable each local data line D to be effectively reduced in length when the number of word lines may be the same as that of any of the conventional flash memories formed on the same design rules, since the space between word lines W may be reduced to ½ of the width (gate length) of the word line W and under. This is why the flash memory in this exemplary embodiment may reduce the variation of the writing characteristic among memory cells, which may depend on where the object memory cell is positioned in the memory mat.

An n-type diffusion layer (not shown) connected to assist gates A through contact holes 31 may be formed in the p-type well 4 in each of the active regions S ( . . . , Sn−2, Sn−1, Sn, Sn+1, Sn+2, Sn+3, . . . ) formed at both ends of the Y direction of a memory mat. This n-type diffusion layer may be connected electrically to local data lines D when n-type inversion layers (local data lines D) may be formed in the p-type well 4 located in the lower part of each assist gate A. Also, a selection MISFET (Q) may be formed by the above described n-type diffusion layer and gate electrodes 21 and 26.

A global data line G (see FIG. 5) may be connected to each of the above described local data lines D through a selection MISFET (Q). The global data line G may be extended over a plurality of memory mats, and a plurality of local data lines D may be connected to one global data line G in a hierarchical data line structure. Consequently, the data line may have less resistance when each of the local data lines D made of a inversion layer having a high resistance are extended, thereby reducing the variation of the writing characteristic among memory cells, which depends on the place of each memory cell in the object memory mat. In addition, because no high data line voltage may be applied to any memory cell except when writing in a selected memory mat, the disturbance of each non-selected memory cell may be reduced. Also, because the charging/discharging capacity may be reduced, the flash memory in this exemplary embodiment may obtain affects of both fast operation and lower power consumption.

Figure 6:
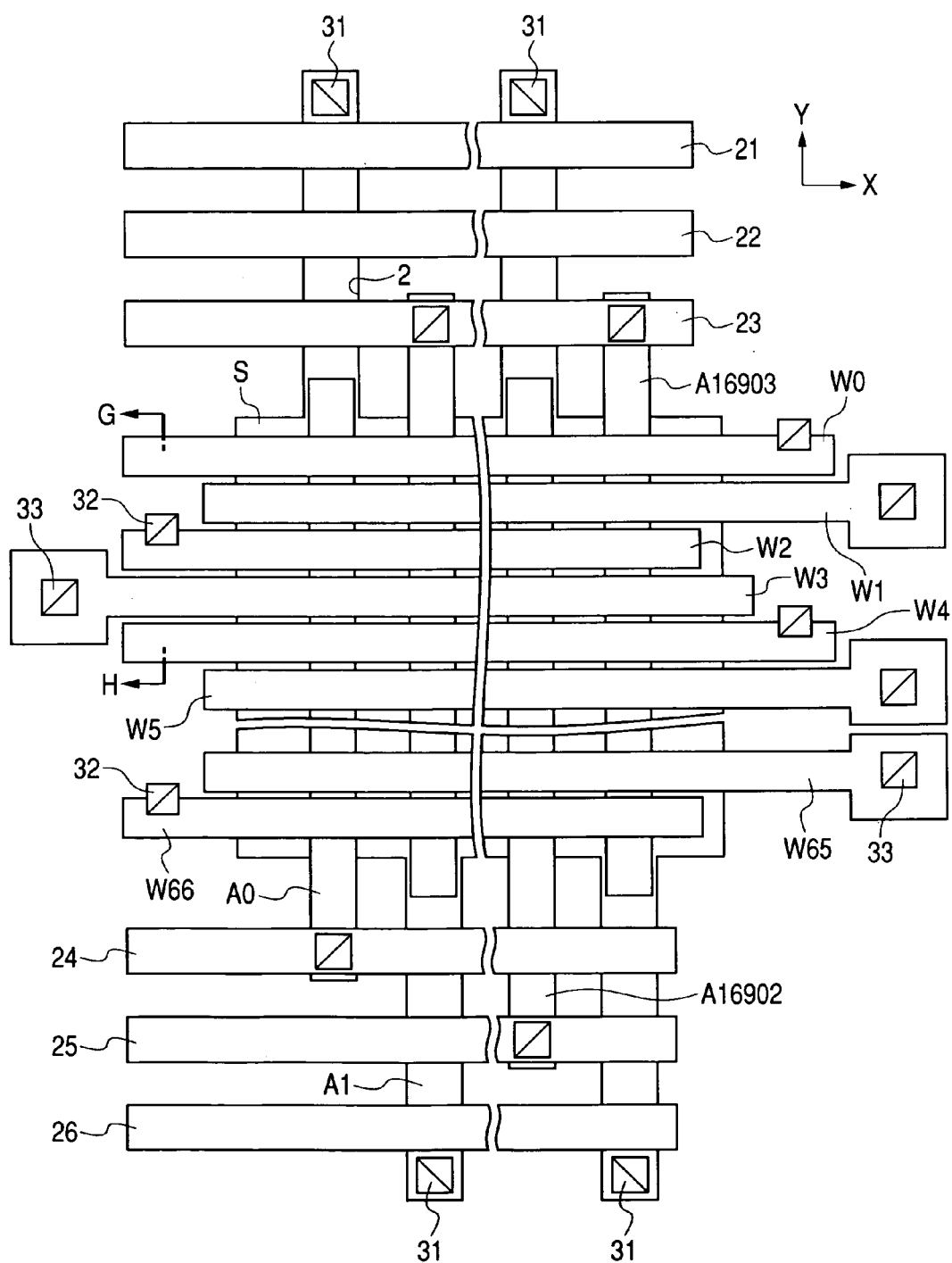
FIG. 6 is a circuit diagram of an equivalent circuit of the semiconductor memory device.
Figure 7:
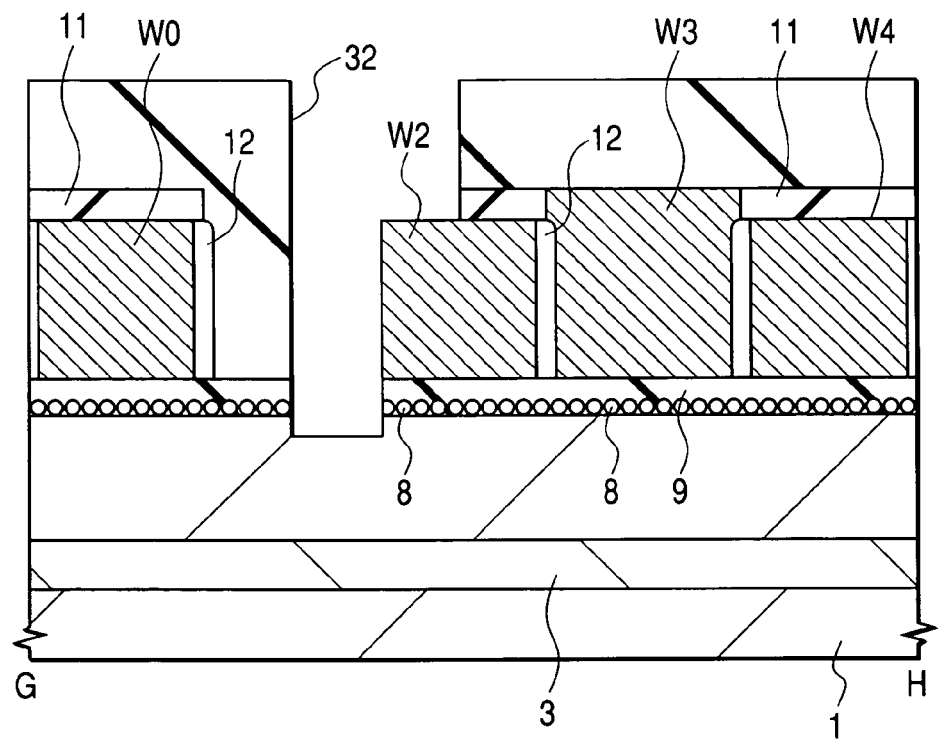
FIG. 7 is still another cross sectional view of the semiconductor substrate along a G-H.

FIG. 6 is a schematic top view of a major portion of contact regions provided at both ends of an X direction of a memory mat, and FIG. 7 is a cross sectional view of the semiconductor substrate along a G-H line (cross sectional direction of word lines W) shown in FIG. 6.

If the space between word lines W is reduced to ½ of the width (gate length) of the word lines W like the flash memory in this exemplary embodiment, the layout of the contacts may be changed between odd-numbered word lines W (W1, W3, W5, . . . W65) and even-numbered word lines W (W0, W2, W4, . . . W66). Contact holes 33 to be connected to odd-numbered word lines W(W1, W3, W5, . . . W65) may be disposed on wide portions (herein termed "dog bone parts") formed at one end of those odd-numbered word lines W. The other ends that are opposite to the wide portions may be cut shorter and the contact holes 32 of the even-numbered word lines W (W0, W2, W4, . . . W66) may be disposed around those shorter ends. Each of the contact holes to be connected to any of the even-numbered word lines W (W0, W2, W4, ... W66) may be protruded partially into a region off the word line W. Because the contact with each even-numbered word line may be assumed not only on the top face, but also on a side face, the contact resistance may not be varied so much even when the contact area on the top face is changed upon an alignment error in the lithography process. In addition, because the contact area increases such way, this structure may also be effective for lowering the contact resistance.

The above described contact holes 32 and 33 may be disposed outside active regions S (isolation regions 2) of the object memory mat, so that the contact holes 32, even when some of them are disposed off the word lines, may never be short-circuited with any other conductor layer electrically. Also, odd-numbered word lines W that may be adjacent to each other (ex., W1 and W3, W3 and W5, W5 and W7, ... ) may be disposed so that locations of their dog bone parts may become opposite to each other, but not in contact with each other.

Figure 8:
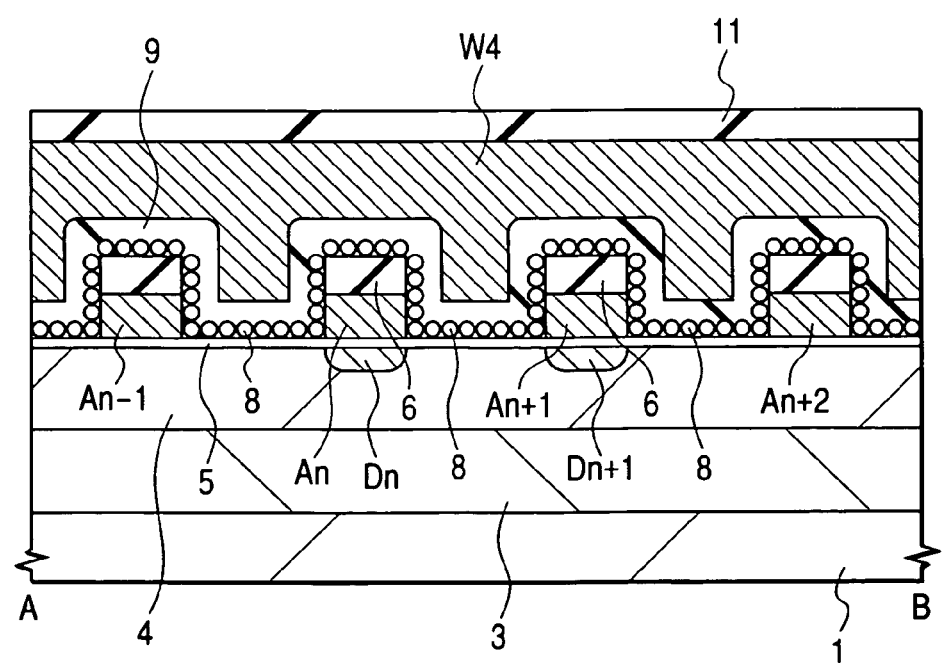
FIG. 8 is a cross sectional view of the memory cell array of the semiconductor memory device.

Next, a description will be made for the operation of the flash memory in the above mentioned exemplary embodiment, with reference to FIGS. 5 and 8, including a memory cell (enclosed in a circle in FIG. 5) driven by a word line (W4), an assist gate (An), and an assist gate (An+1) with respect to writing, erasing, and reading operations, for example. However, the operations may also be the same in any other memory cell in the same memory mat; only the selected word line and assist gates may be changed. In FIG. 5, the assist gates (An and An+1) located at both sides of the object memory cell for writing may be omitted. The local data lines (Dn and Dn+1) made of inversion layers formed under the assist gates may be denoted (An and An+1) may be just denoted. Each charge storage region consisting of a plurality of silicon microcrystal grains may be represented by a single white circle.

The flash memory in this exemplary embodiment may use 4 level threshold values for each charge storage region consisting of microcrystal grains 8 formed between assist gates (An and An+1) to store 2-bit data therein. At that time, the assist gates (An−1 and An+2) adjacent to the assist gates (An and An+1) may function as isolation regions. Also, four assist gates A may be connected into one set. Therefore, when information may be written/read in from a memory cell located between the assist gates (An and An+1), the information may also be written/read in from the memory cell located between the assist gates having numbers different from those of the assist gates (An and An+1) only by a multiple of 4, like, for example, the assist gates (An+4 and An+5).

The correspondence between each threshold value and information is shown in FIG. 9. It is represented as, for example, V3>V2H>V2L>V1H>V1L>V0H>V0L. The correspondence between 2-bit information of "0"/"1" and a threshold level may be varied. The order of the writing threshold levels may also be decided. Writing may be done in a descending order of the threshold levels. The voltage for one (An) of the assist gates (An and An+1) close to the charge storage region of the target memory cell used for writing may be set at 2 V, for example, which may be enough to form a inversion layer, and the other assist gate (An+1) may be set at, for example, 7 V. The voltage for the assist gates adjacent to the assist gates (An and An+1) may be set at a low voltage, such as 0 V, for example, which cannot form any inversion layer to isolate them electrically.

Both the n-type diffusion layer and the local data lines (Dn and Dn+1) may be electrically connected to each other when the inversion layers are formed and a voltage is applied from the global data lines (Gn and Gn+1) through the contact holes 31 connected to the diffusion layer. Those global data lines (Gn and Gn+1) may be set at a predetermined voltage with respect to selecting a control line 22 of the local data line selection MISFET(Q). If the information to be written is not "01", both local lines may be set at Vsw (0 V, for example). If the information to be written is "01", the local data line (Dn) may be set at Vsw (0 V, for example) and the local data line (Dn+1) may be set at a predetermined voltage Vdw (4 V, for example), respectively.

If a writing pulse is applied to a word line (W4) that is a control electrode for a fixed time (3 µs, for example) at a high voltage Vww3 (14 V, for example), a inversion layer may be formed in the p-type well located in the lower part of the word line (W4), electrical field concentration occurs at the boundary with the local data line (Dn) located in the lower part of the assist gate (An), thereby hot electrons may be generated. The generated hot electrons may be pulled into the electrical field vertical to the substrate 1 through the word line (W4) and may be injected into the target memory cell. At that time, because the resistance of the local data line (Dn) located in the lower part of one assist gate (An) may be high, the current that flows between the local data lines (Dn and Dn+1) may not be so large. Consequently, the current may not increase much even when information is written in many memory cells simultaneously. This is why information may be written in many memory cells in parallel, even at a current driving performance of a limited step-up circuit, and why the flash memory may be considered to be suitable for files from which information consisting of many bits is inputted/outputted at a time. Such hot electron injection may be referred to as source side injection.

If the information to be written is not "01", no potential difference may occur between the local data lines (Dn and Dn+1). At that time, therefore, no hot electron may be generated and accordingly no charge injection may occur. Also, if the channel of a memory cell to be driven by a non-selected word line W is disconnected electrically from another when a not-selected word line W is set at a low voltage (for example, 0 V), no information may be written in the memory cell.

A fixed high potential Vdw may be set for one (Dn) of the local data lines (Dn and Dn+1) when writing. However, it may also be possible to employ another driving method in which a high potential may be used to: pre-charge the local data line (Dn); turn off a switch provided between the local data line (Dn) and a power supply line to set the line (Dn) in the floating state; and apply a writing pulse to the object word line W. If a fixed voltage is used for driving an object memory cell, the writing current may be varied due to the high resistance of the local data line made of an inversion layer. However, the pre-charging method may fix the charge, and the variation of the writing characteristic among memory cells may be reduced. This may also be true in other exemplary embodiments described later.

In the configuration of the flash memory of an exemplary embodiment, if injected electrons diffuse in a direction orthogonal to a word line, information may be written in an adjacent memory cell, since the word line may be close to its adjacent word lines. The source side injection may resolve such a circumstance, since the region in which hot electrons may be generated may be narrower than that of the drain side injection, and the energy of generated hot electrons may also be distributed in uniform, thereby generated electrons may not diffuse so much in the direction (parallel to the assist gates) orthogonal to any word line W.

In the above described writing operation in this embodiment, if the potential set for the source side assist gate (An) is further raised (to 3 V, for example) and the resistance of the local data line (Dn) is lowered, the potential difference between a word line W and the drain side local data line (Dn+1) may become smaller than that between the word line W and the source side local data line (Dn). Thus, the electrical field around the drain may become stronger than that around the source. Hot electrons thus come to be generated around the drain and the charge storage region becomes closer to the drain. This drain side injection may also be employed, of course. Also, because the drain side injection lowers the resistance of the local data line (Dn), the local data line voltage drop may be suppressed, thereby the variation of the writing characteristic among memory cells, which depends on where each target memory cell may be located in the memory mat, may be reduced.

The charge storage nodes provided at both sides between the adjacent electrodes (An and An+1) may also be used to increase the storage capacity. Accurate controlling of the charge injection amount required in the above storing method using 4-level charge injection amounts may not be required. The verification operation may thus be simplified, and thereby the writing speed may be improved. In addition, because the difference between the minimum threshold level and the maximum threshold level may be reduced, the writing voltage may be lowered and written information may be more stably retained. In order to realize such storing of information, the source side injection and the drain side injection as described above may be combined and the set voltages of both source side and drain side assist gates (An and An+1), as well as those of the local data lines (Dn and Dn+1), may be exchanged when in the source side injection.

After that, a reading operation may be done from the memory cell to verify whether or not the threshold value Vth may be higher than V3. The details of the reading operation will be described below. If the information to be written is "01" and the threshold value Vth is not higher than V3, the local data line (Dn+1) may be set at the predetermined voltage Vdw (4 V, for example) again. If the threshold value Vth is higher than V3, the local data line (Dn+1) may be set at Vsw (0 V, for example), and then the writing pulse may be applied to the word line (W4). After that, the information may be read again to verify it and the writing pulse may be applied to the word line (W4) again, if necessary. Such an operation sequence may be repeated until target information may be read completely.

In the memory cell array configured in this exemplary embodiment, adjacent memory cells may be used for electrical isolation. Therefore, a writing operation may be done for the assist gates A of one of the four memory cells selected from among those driven by the same word line (W4). When all the memory cells subjected to the writing pass the verification test, the "01" writing sequence may end. After that, the system may go to the "00" writing sequence.

In such a case, if the information to be written is "00", the voltage of the local data line (Dn+1) may be set at the predetermined voltage Vdw (4 V, for example). If not, the voltage of the local data line (Dn+1) may be set at the same voltage Vsw (0 V, for example) as that of the local data line (Dn). The potential set for the assist gates A may be the same as that of the "01" writing sequence. After that, the writing pulse may be applied to the word line (W4). The voltage Vww2 of the writing pulse may be lower than the Vww3, at, for example, 12 V. At that time, if the pulse width is the same as that of the "01" writing, the charge electrons to be injected may be less and the writing may be done on a lower threshold level. The verification test may also be done in the same way as that described above, except that the threshold value may need to be set higher than V2L and lower than V2H. It may be required that charge electrons may not be injected excessively with the first writing pulse, and the width of the second and subsequent pulses may be reduced, to prevent excessive injection of charge electrons. When all the memory cells in which information is written pass the verification test, the "00" writing sequence may end, and then the system may go to the "10" writing sequence. In the "10" writing, the writing voltage Vww1 may be set lower than Vww2, at, for example, 10 V, and the target threshold range may be changed from that of the "00" writing. Other operations may be the same as those of the "00" writing. After that, the "01" writing sequence may be done and the writing in the memory cell may be completed.

Although the writing pulse voltage to be applied to the word line (W4) through each sequence may be fixed when writing information, it may also be possible to use a pulse string that applies a higher voltage according to an increase of the writing frequency to end the object wiring sequence faster.

Erasing information from a plurality of memory cells driven by the same word line may be done. A positive voltage Vew (ex., 20 V) higher than the Vww3 may be applied to the word line W. The potential of the charge storage region may be low after electrons have been injected therein. The electrical field of the inter-layer insulator 9 thus may become stronger than that of the tunnel insulator (gate oxide film 5). As a result, electrons may be ejected toward the control electrode (W4), and thereby the threshold value of the memory cell may go lower. The erasing method is not limited to only this example, and may be changed accordingly. For example, a negative voltage (ex., −18 V) may be applied to the target word line W and electrons may be ejected toward the substrate 1. It may also be possible to apply a negative voltage (ex., −3 V) to the p-type well 4 and a positive voltage (ex., 3 V) to the local data lines (Dn−2, Dn−1, Dn, Dn+1, Dn+2, and Dn+3), then a negative voltage (ex., −13 V) to the word line, to inject holes therein to erase information therefrom. This hole injection may enable information to be erased only from selected memory cells by selecting the inversion layers to be set at a negative voltage.

To read 4-level information, at first it may be determined whether or not the threshold level is "00" and over, that is, V2L and over, or "10" and under, or VH1 and under. The local data line (Dn) may be pre-charged to a lower potential Vsr (ex., 0 V) and the local data line (Dn+1) may be pre-charged to a higher potential Vdr (ex., 1.0 V) through the global data lines (Gn and Gn+1).

After that, a voltage Vrw1 of V1H<Vrw1<V2L may be applied to the word line (W4). If the threshold value level of the object memory cell is V1H and under, the local data line (Dn) and the local data line (Dn+1) may be connected electrically to each other. If the threshold value level is V2L and over, they may not be connected electrically to each other, or they are high in resistance. If the result is V1H and under, the local data lines (Dn) and (Dn+1) may be pre-charged as described above, and then a voltage Vrw0 of V0H<Vrw0<V1L may be applied to the word line (W4) to determine whether the threshold value level of the object memory cell is "11" or "10", according to the difference between the currents flowing in the word line (W4). If the first reading result is V2L and over, the local data lines (Dn) and (Dn+1) may be pre-charged as described above, and then a voltage Vrw2 of V2H<Vrw2<V3 may be applied to the word line (W4). After that, the threshold value level may be "00", "10", or "01", according to the difference between the currents flowing in the word line (W4).

In the above reading operation, it may also be possible to read object information after completing the reading operations with use of Vrw0, Vrw1, and Vrw2 without changing the voltage to be applied, according to the result obtained with use of Vrw1. The former reading method may be suitable for fast reading, since it may require voltage application just twice while the latter method may simplify the control circuit, although it may require voltage application three times.

If the charge storage regions at both sides as described above are used, the local data lines (D) and (Dn+1) may be changed in function to read object information. The precharge voltage Dvr for reading may be set higher than that of the maximum threshold value level. As a result, if the voltage Vdr is applied to the local data line (Dn+1), a channel pinch-off event may occur around the local data line (Dn+1), so that information may be read from the charge storage region around the local data line (Dn) without being affected by the information stored in the charge storage region around the local data line (Dn+1). Similarly, if a voltage Vdr is applied to the local data line (Dn), information may be read from the charge storage region around the local data line (Dn+1).

Figure 10:
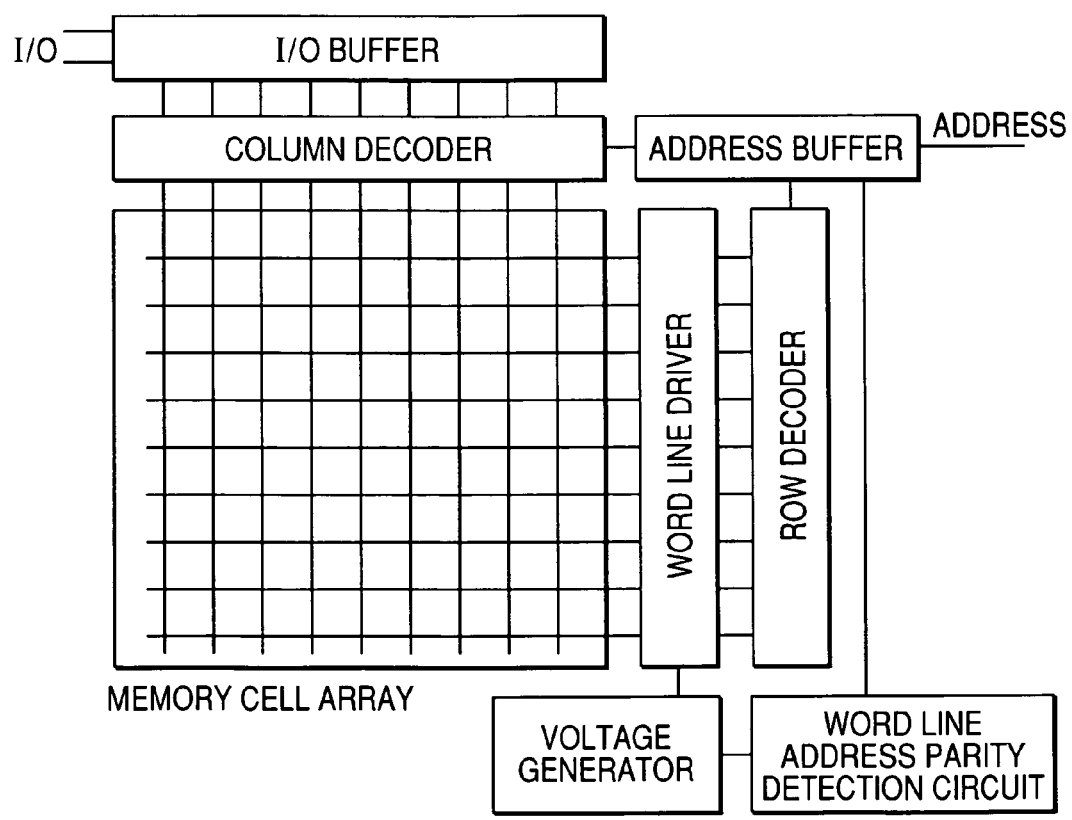
FIG. 10 is a block diagram of the semiconductor memory device.

In this exemplary embodiment, the even-numbered word lines (W0, W2, W4, . . . , W66) and the odd-numbered word lines (W1, W3, W5, . . . , W65) may be formed in different processes. This characteristic may differ between adjacent word lines. Because the word line width, the interlayer insulator thickness, etc. may be different between the even-numbered word lines and the odd-numbered word lines, the writing, erasing, and reading characteristics might differ between even-numbered word lines and odd-numbered word lines. As shown in FIG. 10, a solution to this may be that the voltage generated by the regulator provided in the voltage generator may be changed according to whether the object word line is even numbered or odd-numbered so as to enable the operation voltage to be changed.

Although a word line voltage may be used to compensate the characteristic difference between even numbered word lines and odd-numbered word lines in this exemplary embodiment, a pulse width may be used for the same purpose. In addition, the data line voltage and the voltage to be applied to assist gates may be changed according to whether the object word line is even numbered or odd numbered. Such methods may also be used in other preferred embodiments of the present invention as described herein to obtain the same effect.

Figure 11:
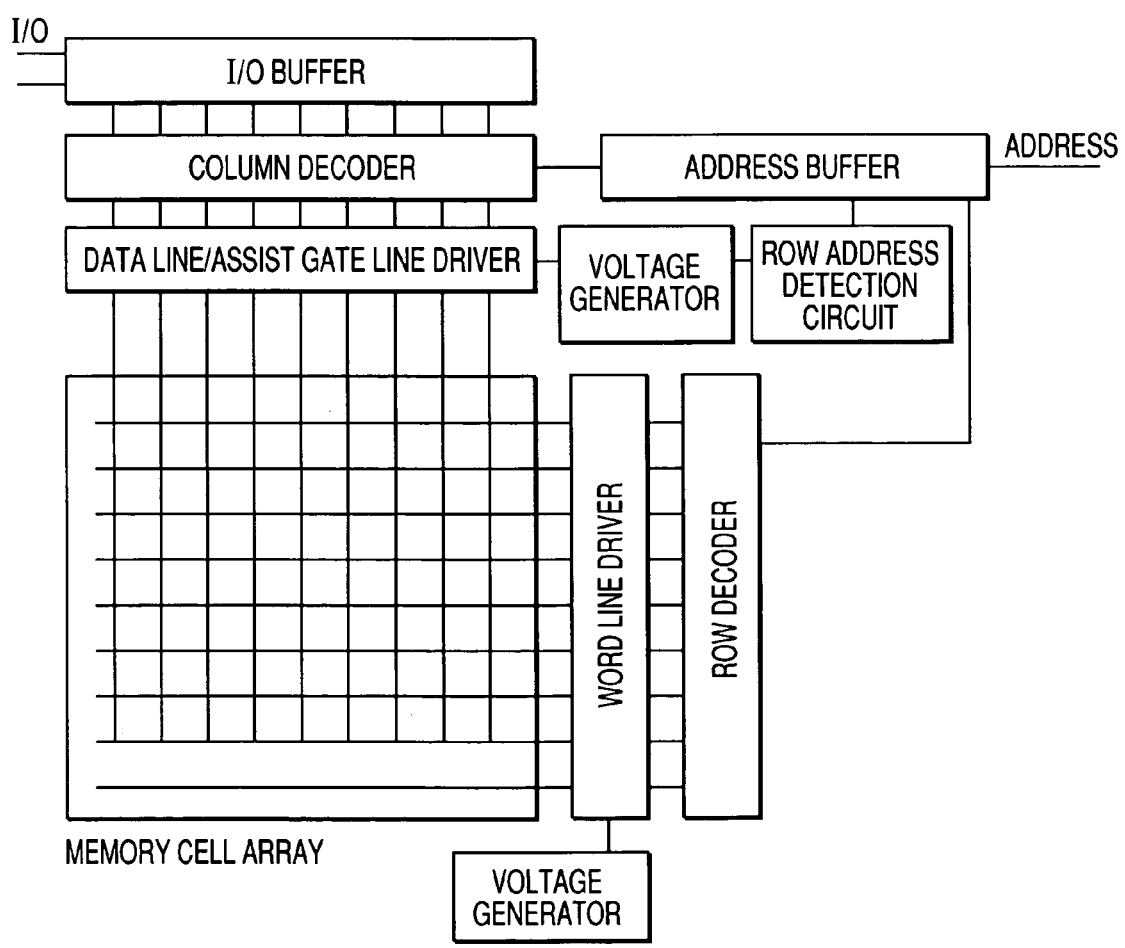
FIG. 11 is another block diagram of the semiconductor memory.

It may also be possible to control the voltage of each assist gate according to the position of the target memory cell in the memory mat to suppress the variation of the writing characteristic among memory cells, which may depend on the position of each target memory cell in the memory mat. For example, the circuit configuration as shown in FIG. 11 may be employed to change the supply voltage according to how far the address of a target word line W selected when writing may be separated from the contact with the corresponding high voltage side local data line in the memory mat. If the contact is close in position, it may mean that the address may be far from the low voltage side contact. Consequently, if a writing current flows due to a voltage drop and the contact is close in position, both the source and drain voltages of the subject memory cell may rise higher than when the contact is far in position. The current thus decreases and the word line voltage may go lower than that of the source region, which may be a reference voltage. Accordingly, the writing may often slow down.

A higher voltage may be set for the assist gate A corresponding to the low voltage side local data line. The source side voltage may thus be suppressed from increasing, and thereby the characteristics of both sides may become identical. In the case of the assist gate controlling as described above, the voltage may be changed for each address in steps. However, it may also be possible to divide a plurality of word lines W into groups and apply different voltages to those groups. This method may simplify the assist gate controlling more.

Referring to FIGS. 12 through 21, producing the flash memory in an exemplary embodiment is shown. Here, a description is made for a memory cell array.

Figure 12:
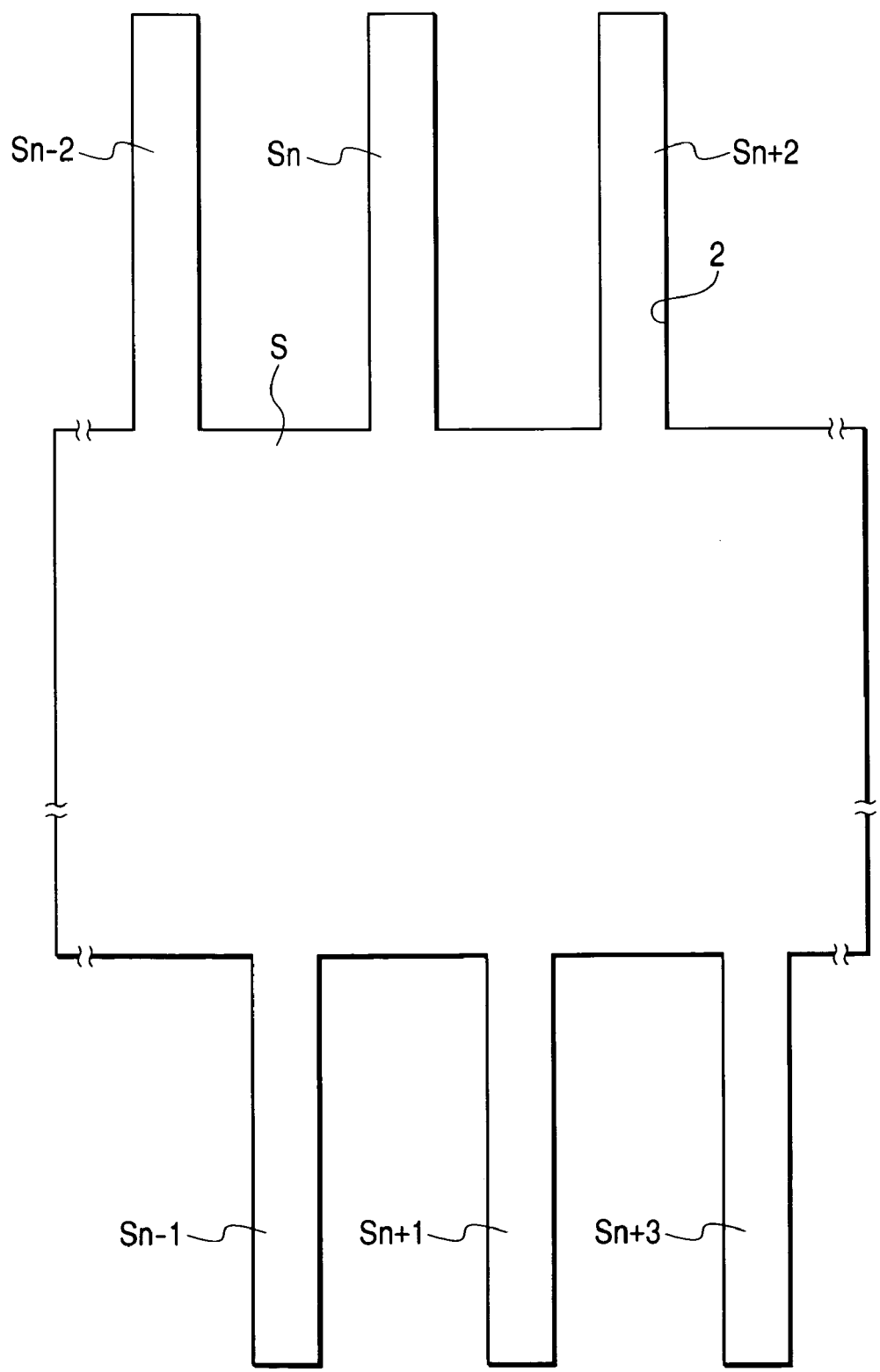
FIG. 12 is a top view of a memory mat for describing how to manufacture the semiconductor memory device.

At first, an isolation region 2 and an active region S may be formed on the substrate 1 with use of a known isolation technique. FIG. 12 shows a top view of the active region S and its peripheral isolation region 2 formed in a memory mat. As shown in FIG. 12, the isolation region 2 may be formed only at each assist gate bundling part provided at an end of the memory mat, at the contact lead-out part of each inversion layer (local data line), and at each word line contact part.

Figure 13:
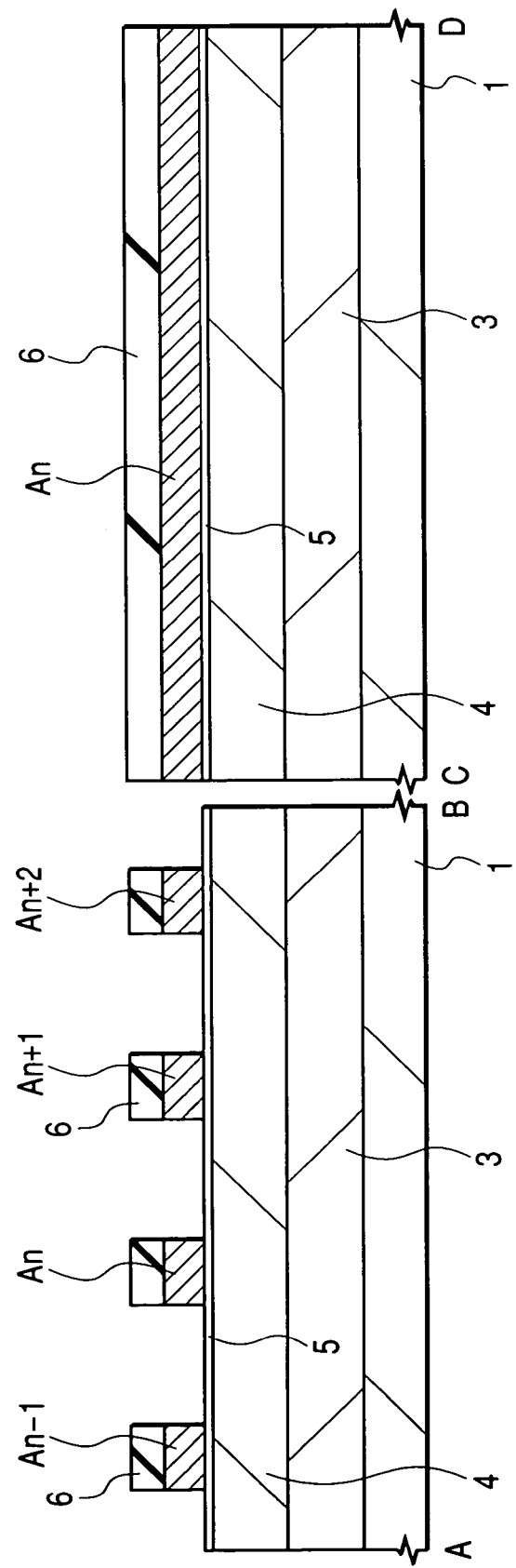
FIG. 13 is a cross sectional view of a major portion of the memory mat for describing how to manufacture the semiconductor memory device.

Next, as shown in FIG. 13, the substrate 1 may be subjected to an impurity ion injection process to form an n-type well 3 and a p-type well 4, and then to an ion injection process so as to adjust the threshold voltage. After that, the substrate 1 may be subjected to a thermal treatment process to form a gate oxide film (tunnel insulator) 5 at a thickness of about 7 nm on the surface of the p-type well 4.

Figure 14:
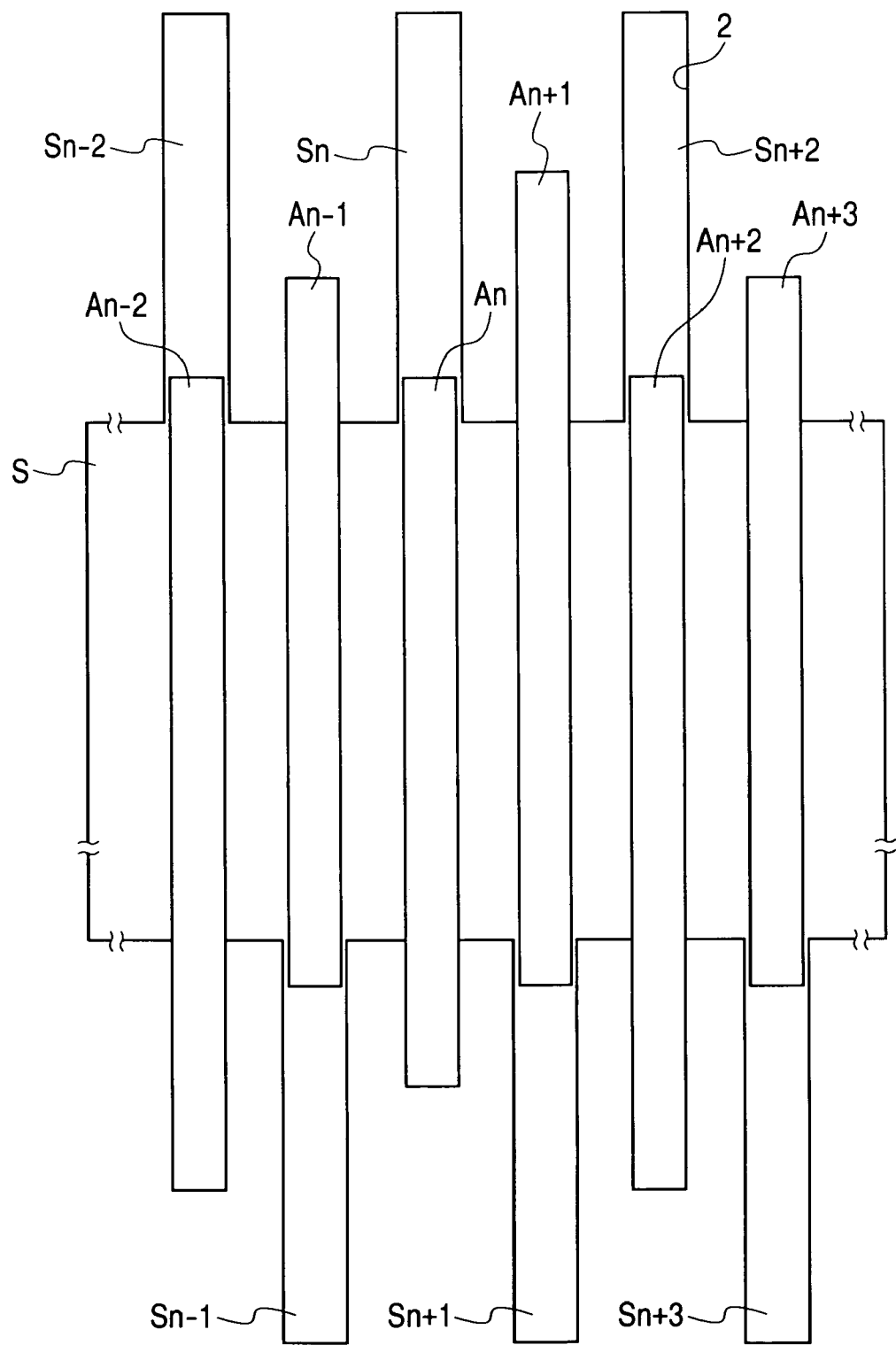
FIG. 14 is a top view of the memory mat for describing how to manufacture the semiconductor memory device.
Figure 15:
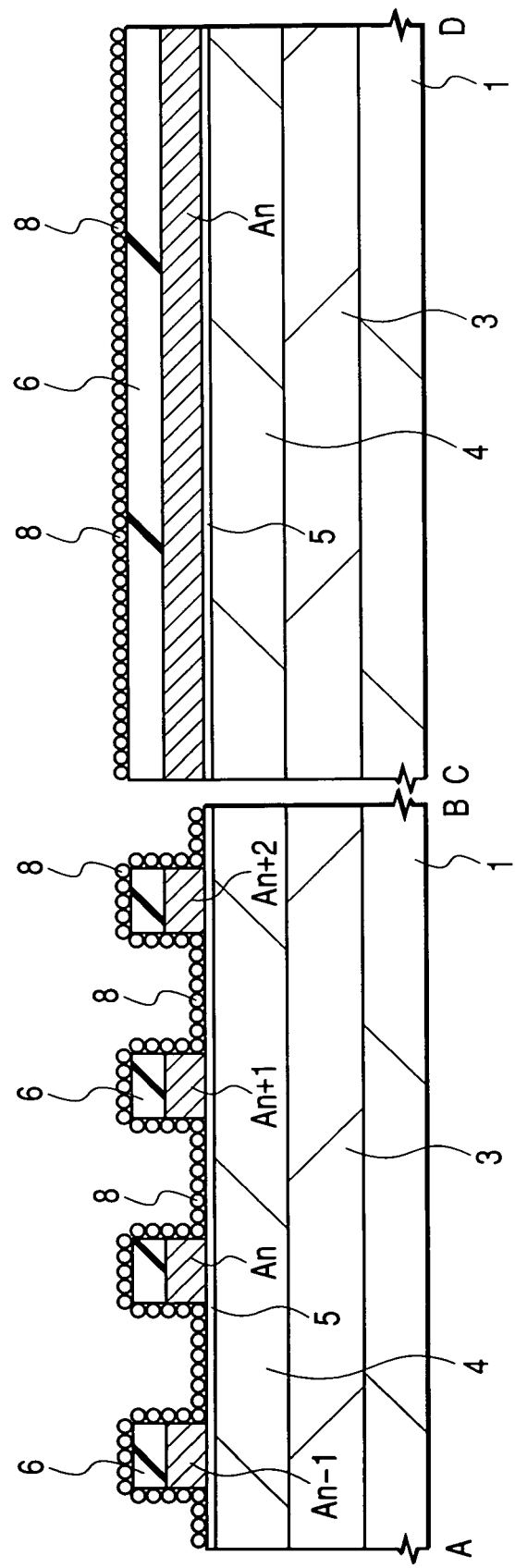
FIG. 15 is a cross sectional view of a major portion of the memory mat for describing how to manufacture the semiconductor memory device.

After that, assist gates A may be formed on the gate oxide film 5 by depositing an n-type polycrystalline silicon film with use of the CVD method, then depositing a cap insulator 6 made of oxide silicon thereon with use of the CVD method. After that, the cap insulator 6 and the n-type polycrystalline film may be patterned with use of a photography technique. FIG. 14 shows a top view of some assist gates A (An−2, An−1, An, An+1, An+2, and An+3). The actual number of the assist gates A may be, for example, 16904 formed in a 2048-byte region that includes a 512-byte management region and 8 dummy assist gates.

After that, the substrate 1 may be subjected to another ion injection to adjust the impurity density on its surface, then silicon microcrystal grains 8 of about 10 nm in diameter may be formed on the substrate 1 at a density of $4\times10^{11}/cm^2$. At that time, but prior to the forming of the microcrystal grains 8, the gate oxide film 5 formed in the space region of each assist gate A may be removed by hydrofluoric acid to expose the surface of the p-type well 4. Then, the substrate 1 may be subjected to a thermal treatment process to form a clean silicon oxide film of about 8 nm in thickness on the surface of the p-type well 4.

After forming the microcrystal grains 8, the surface may be oxidized by plasma oxidation up to a depth of 4.5 nm, and then may form another layer of microcrystal grains 8 in the upper part of the preceding layer of the microcrystal grains 8. Although this method may form the microcrystal grains 8 at a higher density, those grains 8 may not come in contact with each another. Consequently, more electrons may be trapped than by other methods under the same writing condition. This may make it possible to secure more margin between written information items, and thereby the writing characteristic may be stabilized.

Plasma oxidation and forming of microcrystal grains 8 as described above may be repeated several times to form the microcrystal grains 8 in a plurality of layers. Unlike the thermal oxidation, plasma oxidation may oxidize the object within the distance of the radical invasion. This is why plasma oxidation may prevent the microcrystal grains 8 formed in the first step from becoming very small in size, even when the plasma oxidation process is repeated by several times and the tunnel insulator film (gate oxide film 5) grows excessively in deposition.

Figure 16:
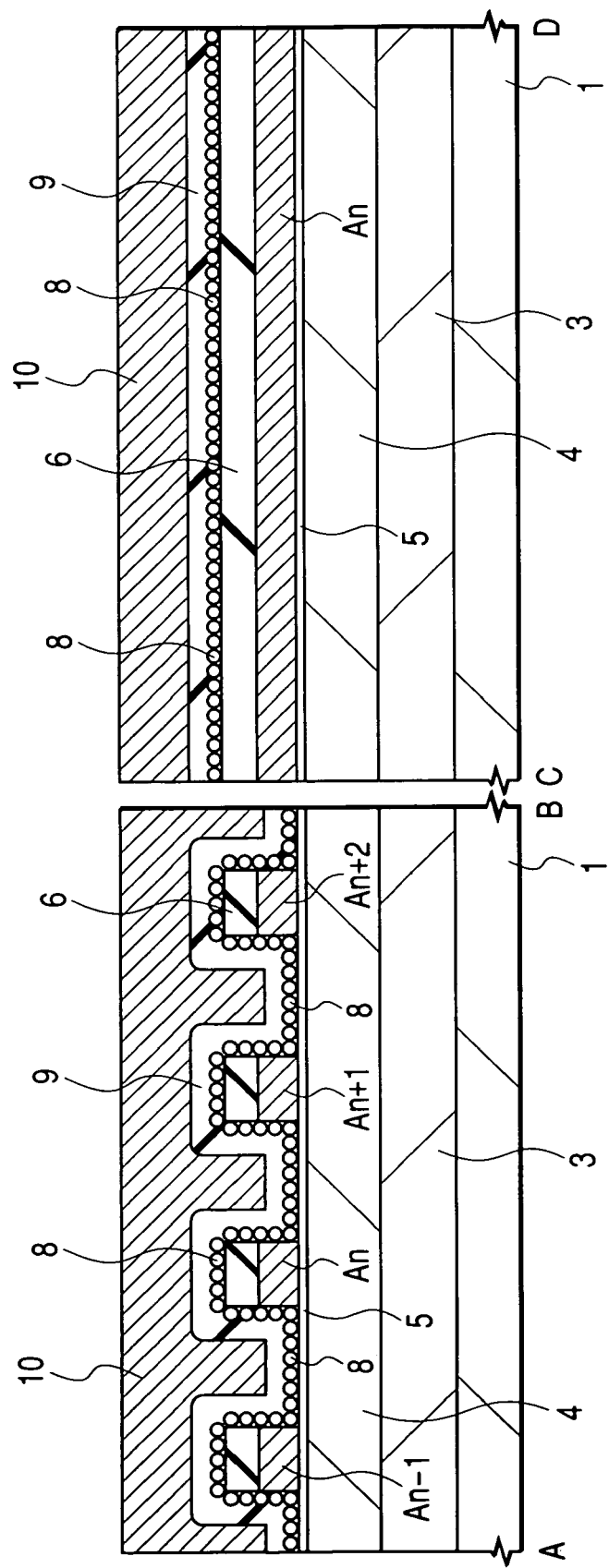
FIG. 16 of is another cross sectional view of the major portion of the memory mat for describing how to manufacture the semiconductor memory device.

As shown in FIG. 16, an interlayer insulator 9 may be deposited on the substrate 1, and then a polycrystalline silicon film 10 may be deposited on the insulator 9 with use of the CVD method. After that, the surface of the silicon film 10 may be flattened by the CMP (Chemical Mechanical Polishing) method. The inter-layer insulator 9 may be formed as a three-layer one consisting of an silicon oxide film of about 5 nm, a silicon nitride film of about 8 nm, and a silicon oxide film of about 5 nm in thickness.

Figure 17:
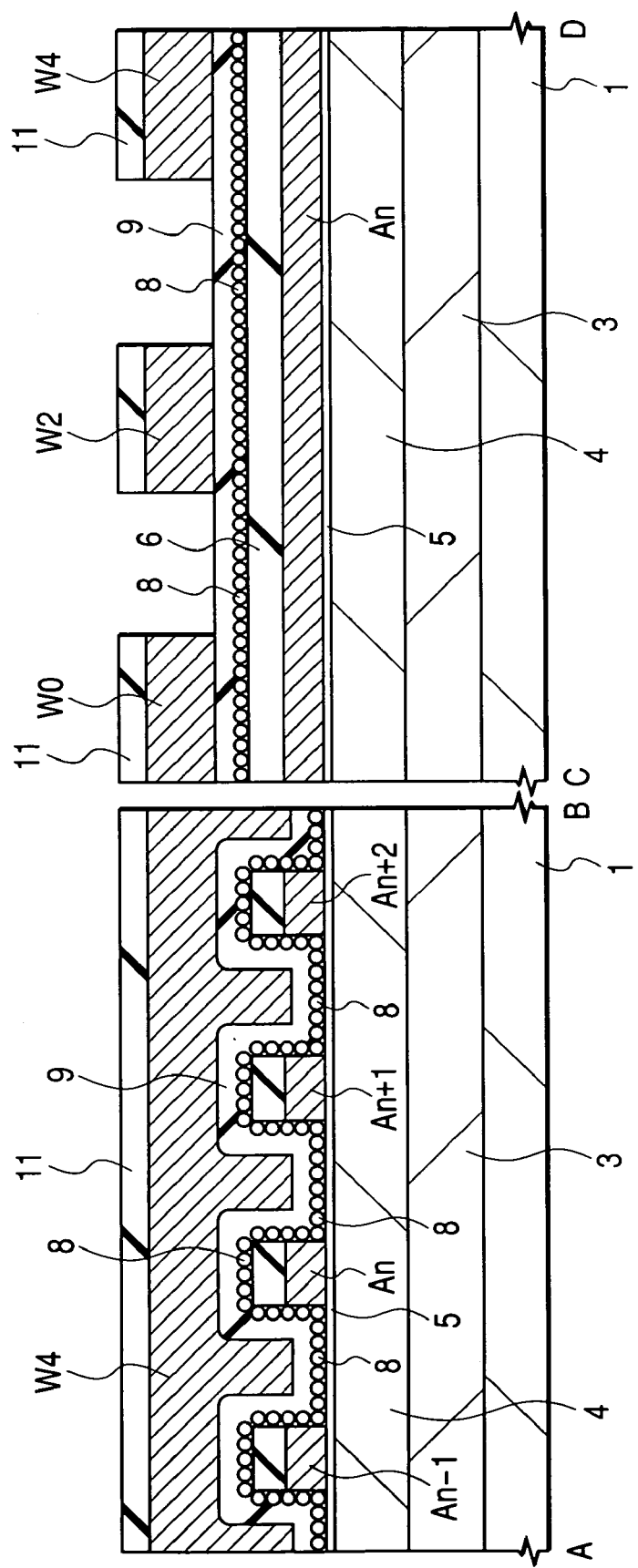
FIG. 17 is still another cross sectional view of the major portion of the memory mat for describing how to manufacture the semiconductor memory device
Figure 18:
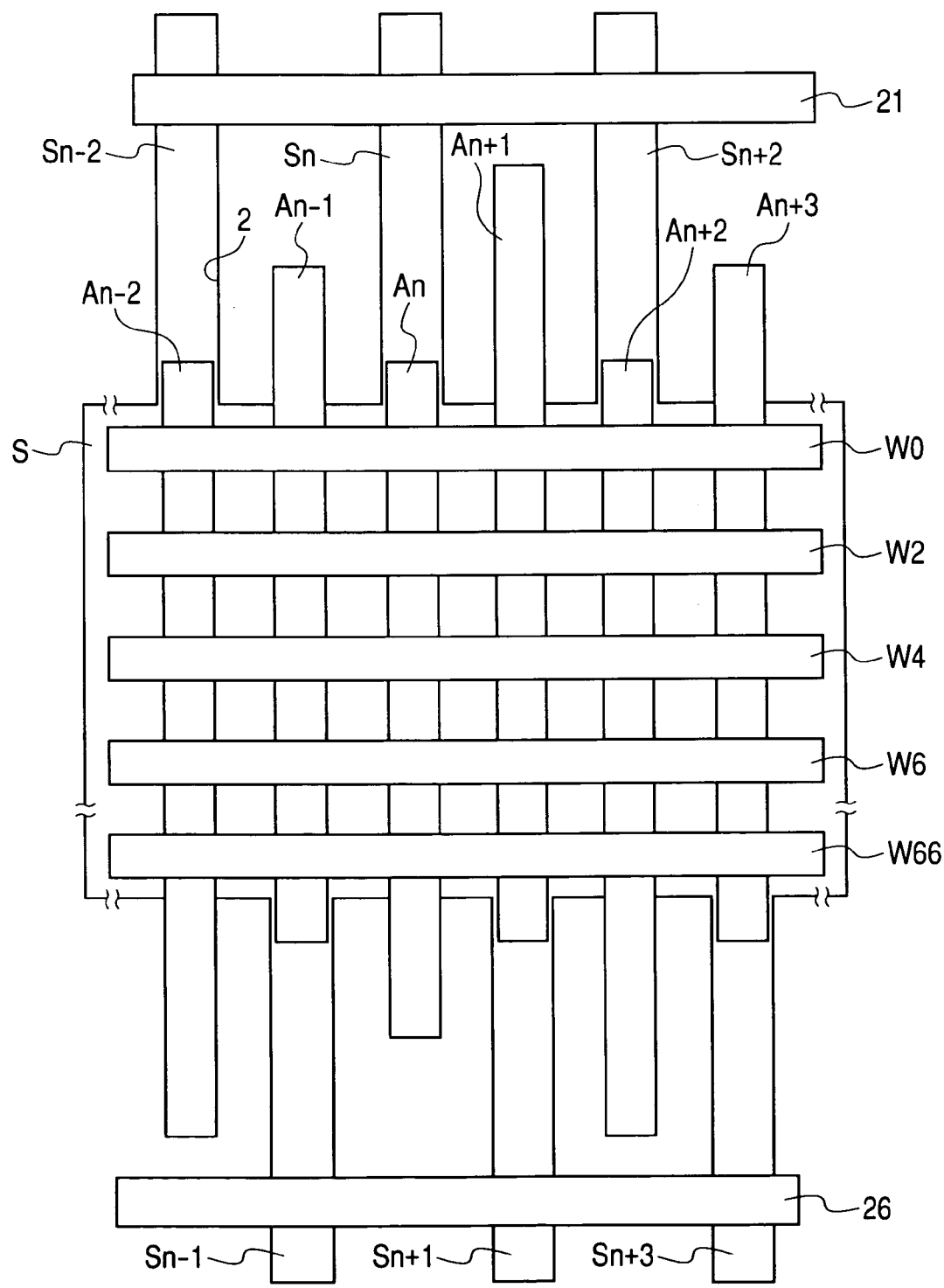
FIG. 18 is a top view of the memory mat for describing how to manufacture the semiconductor memory device.

A silicon nitride film 11 of about 25 nm in thickness may then be deposited in the upper part of the silicon film 10 by the CVD method. After that, as shown in FIG. 17, the silicon nitride film 11 and the polycrystalline silicon film 10 may be patterned with use of the photography technique to form word lines W, each being of a polycrystalline silicon film 10 covered by the silicon nitride film 11. FIG. 18 shows a top view of some of the word lines W. As shown in FIG. 18, word lines W formed in that process may be even-numbered (W0, W2, W4, . . . , W66) among the 67 word lines (W0, W1, W2, . . . , W66) described above. At that time, the gate electrodes 21 and 26 of the selection MISFET (Q) may also be formed.

Figure 19:
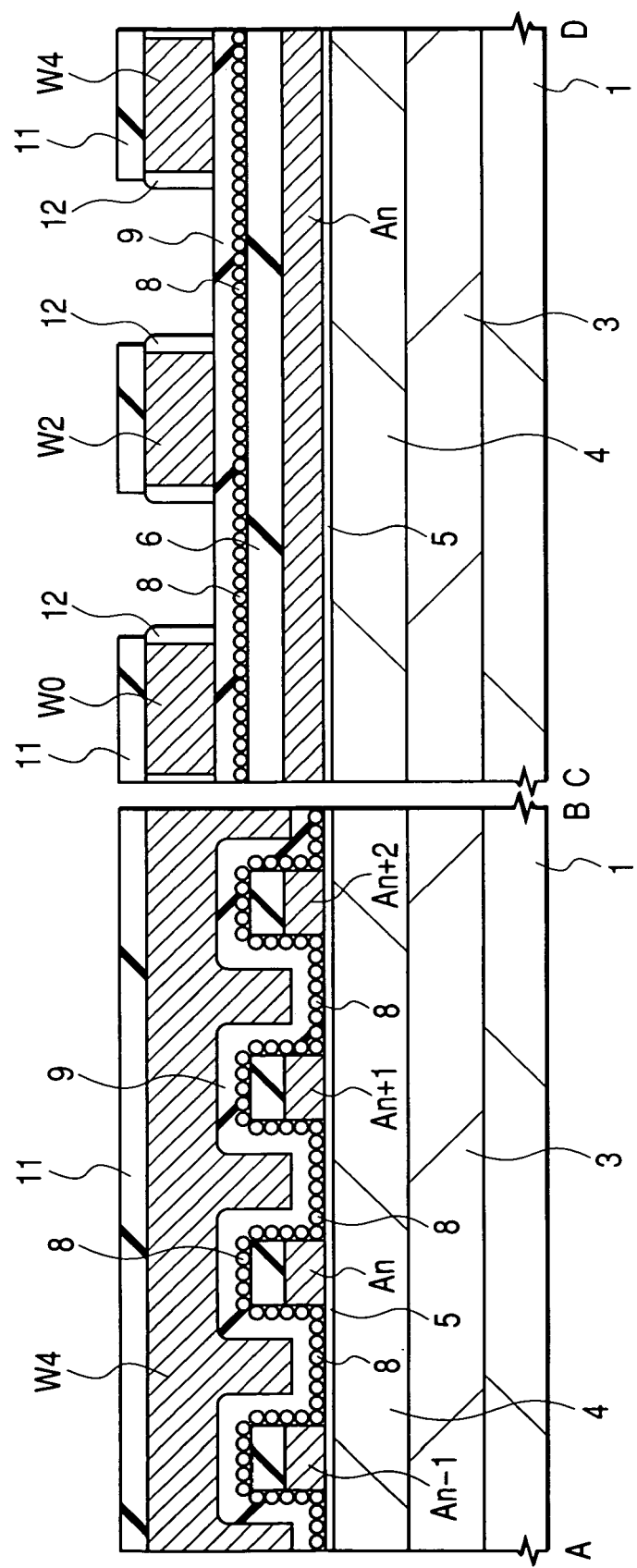
FIG. 19 is still another cross sectional view of the major portion of the memory mat for describing how to manufacture the semiconductor memory device.

Also, as shown in FIG. 19, the substrate 1 may be subjected to a thermal oxidation process to form a side wall spacer 12 of a silicon oxide film of about 20 nm in thickness at a side face of each word line W (polycrystalline silicon film 10) that might not be covered by the silicon nitride film 11. At that time, the silicon nitride film formed in the interlayer insulator 9 that covers both assist gates A and microcrystal grains 8 may have resistance to oxidation, so that none of the assist gates A and the microcrystal grains 8 may be oxidized.

Figure 20:
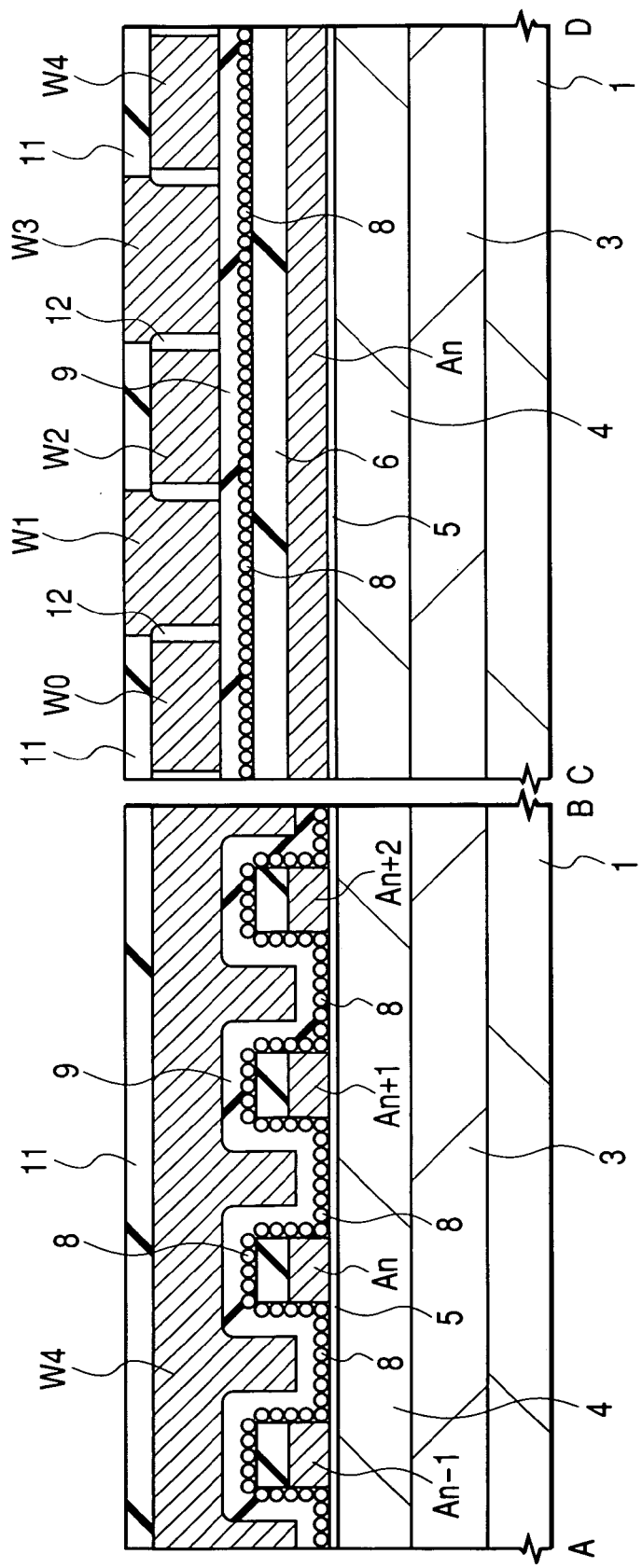
FIG. 20 is still another cross sectional view of the major portion of the memory mat for describing how to manufacture the semiconductor memory device.
Figure 21:
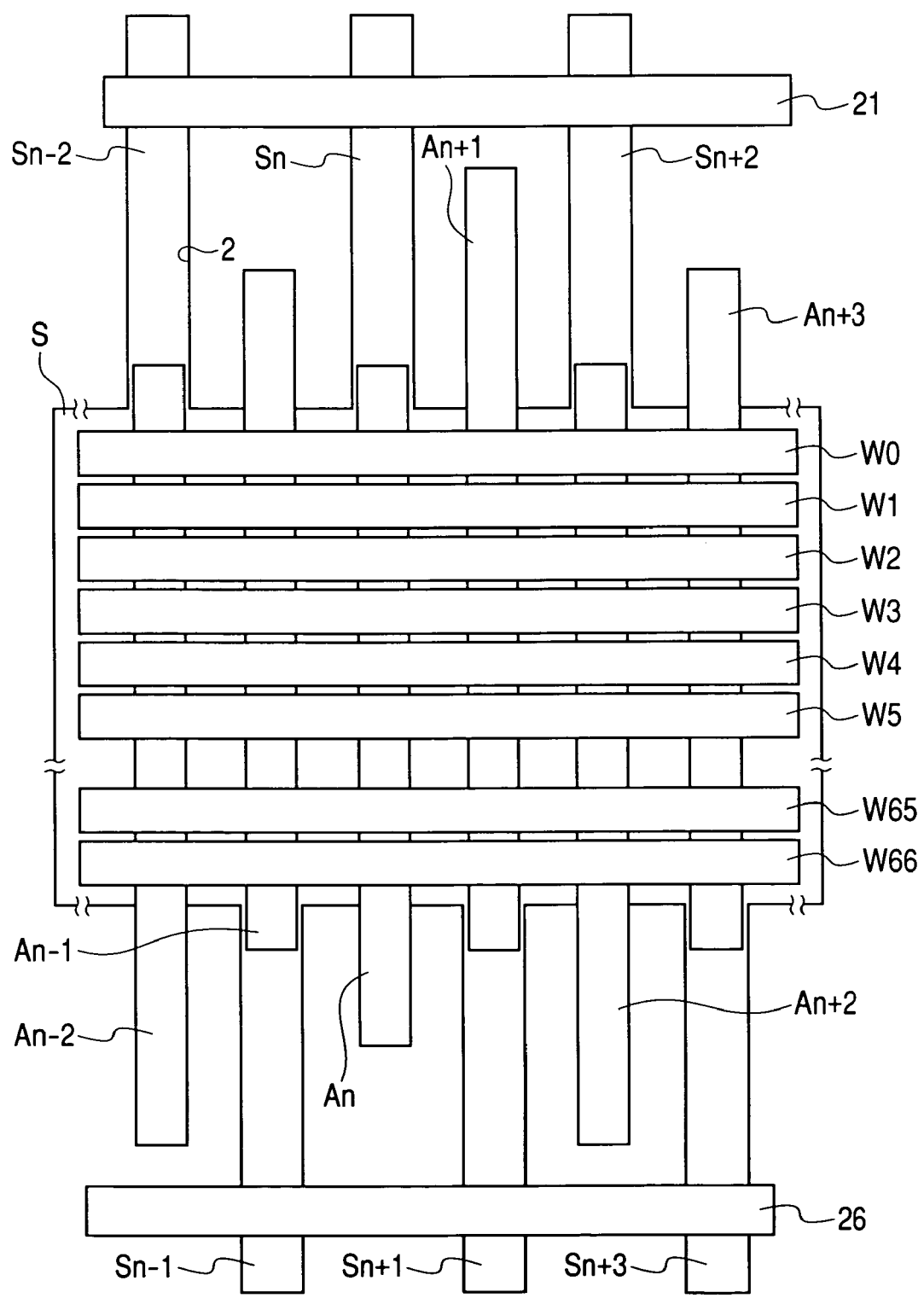
FIG. 21 is another top view of the memory mat for describing how to manufacture the semiconductor memory device.

After that, as shown in FIG. 20 and FIG. 21, word lines W (W0, W2, W4, . . . , W66), each consisting of an n-type polycrystalline silicon film, may be formed in their space regions. The word lines W formed in that process may be odd-numbered (W1, W3, W5, . . . , W65) among the above-described 67 word lines (W0 to W66).

The word lines W described above may be formed by depositing an n-type polycrystalline silicon film on the substrate 1 with use of the CVD method, then flattening the surface of the silicon film with use of the CMP method. When the CMP method is used to polish the polycrystalline silicon film, the polishing may stop on the surface of the silicon nitride film 11 that covers the top face of each of the word lines (W0 to W66) formed as described above. As a result, a level difference equivalent to the thickness of the silicon nitride film 11 may appear between the top faces of the even numbered word lines (W0, W2, W4, . . . , W66) formed first and the top faces of the odd-numbered word lines (W1, W3, W5, . . . , W65) formed after them.

After that, an interlayer insulator (not shown) may be formed in the upper part of each word line W, and then contact holes 31 to 33 shown in FIG. 1 may be formed. After that, control lines 22 to 25 of the assist gates A may be formed by the metallic line in the first layer. Then, an interlayer insulator (not shown) may be formed in the upper part of the control lines 22 to 25, then global data lines G (see FIG. 5) may be formed by the metallic line in the second layer.

In this exemplary embodiment, wells may all be formed as p-type, and electrons may be used as carriers. However, the wells may be n-type ones and holes may be used as carriers. In the latter case, the strong-weak relationship between voltages may be reversed from that illustrated in this embodiment. This may also be true in other embodiments of the present invention.

In addition, although the cap insulator 6 that covers the top faces of the even numbered word lines (W0, W2, W4, . . . W66) formed may be formed as a silicon nitride film, any other insulator material may be used for the insulator 6 if it has an etching selection ratio adequate with respect to the conductor material used for forming the word lines. For example, a silicon oxide film may do. The material for forming word lines W may also become different between even numbered word lines (W0, W2, W4, . . . , W66) and odd-numbered word lines (W1, W3, W5, . . . , W65).

The microcrystal grains 8 used to form the charge storage regions may be formed by a semiconductor material other than silicon or metallic material. They may also be formed by an insulation material (such as silicon nitride film, for example) having a charge trapping function. If the charge storage regions are formed by microcrystal grains 8 as in this exemplary embodiment, memory nodes may be insulated from each other. Therefore, there may be no need to isolate those memory nodes from each other, although it may be required for the memory nodes in each conventional flash memory. This is why such memory nodes may be treated similarly to this embodiment. The same effect may be obtained even when an insulation material having a charge trapping function is used for forming the charge storage regions.

If microcrystal grains 8 are to be used to form charge-storage regions, the periphery of each charge-storage region may be enclosed by such an insulation material as a silicon oxide film having no trapping function. Therefore, it may be possible to select a material that does not cause charge transfer between microcrystal grains 8 easily. Consequently, charge storage regions may come to have excellent charge retaining characteristics. This method may thus be suitable for multi-bit memory type flash memories with less threshold variation margin. If word lines are disposed very closely with each other as in this exemplary embodiment, and charge transfer may occur in a direction orthogonal to the extended direction of the word lines W, a specific problem may arise. The characteristics of adjacent memory cells may become varied. This is why it is recommended to use microcrystal grains 8 to form charge storage regions.

Because the silicon nitride film may enable etching to have a selection ratio with respect to the silicon oxide film, it may be easier to treat the silicon nitride film than the microcrystal grains 8. Although the interlayer insulator 9 that isolates charge storage regions (microcrystal grains 8) from gate electrodes W may be formed as a laminated film of a silicon oxide film, a silicon nitride film, and a silicon oxide film in this exemplary embodiment, the insulator 9 may also be formed of alumina. Alumina has resistance to oxidation, so it may have the same effect as that of the silicon nitride film. In addition, because alumina is high in dielectric constant and the voltage applied to each word line W may be transferred efficiently between each charge storage region and the surface of the substrate 1, writing may be done fast. The description for the configurations of the charge storage region and the interlayer film may also apply to other embodiments of the present invention.

Figure 22:
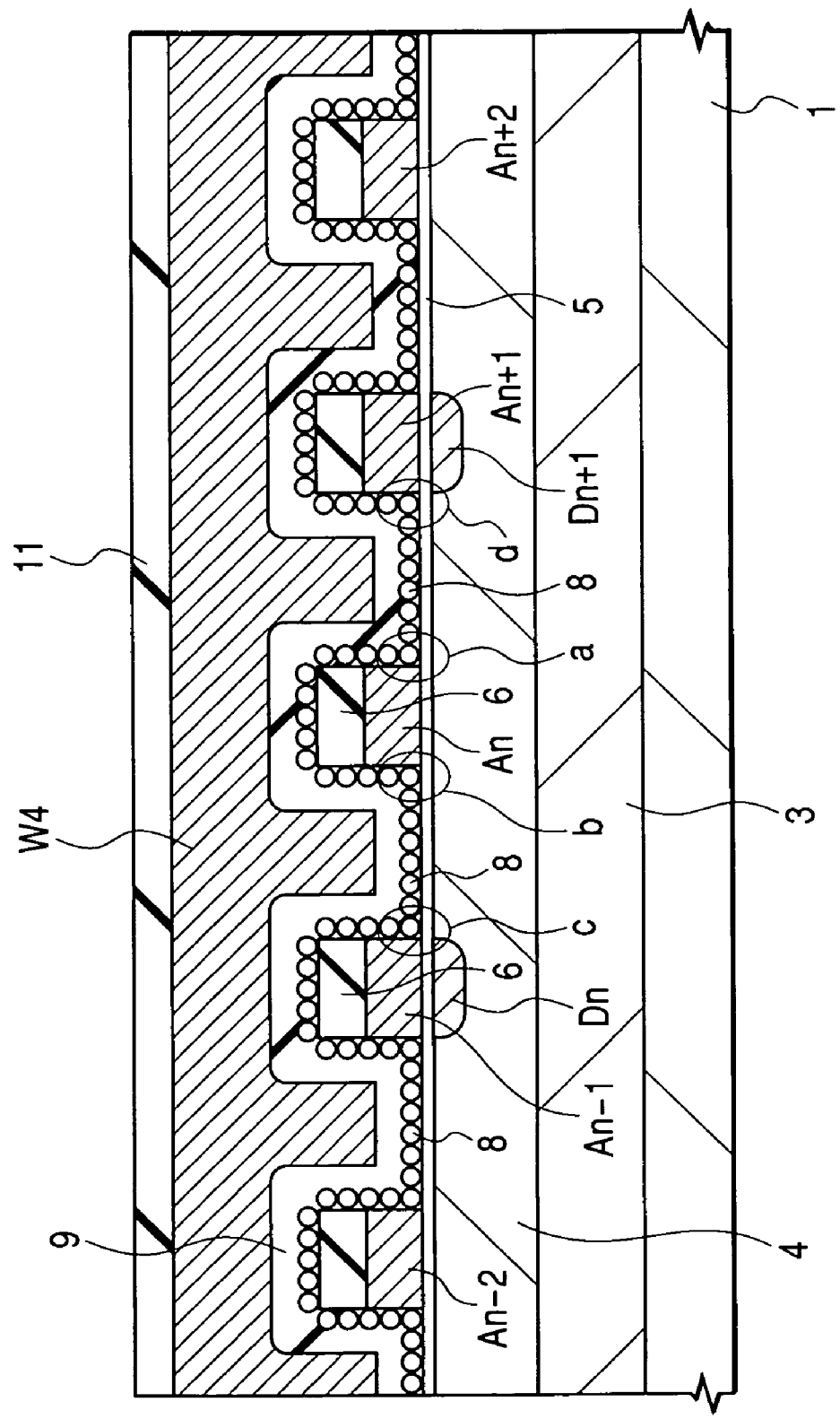
FIG. 22 is a cross sectional view of a major portion of the semiconductor substrate of the semiconductor memory device.
Figure 23:
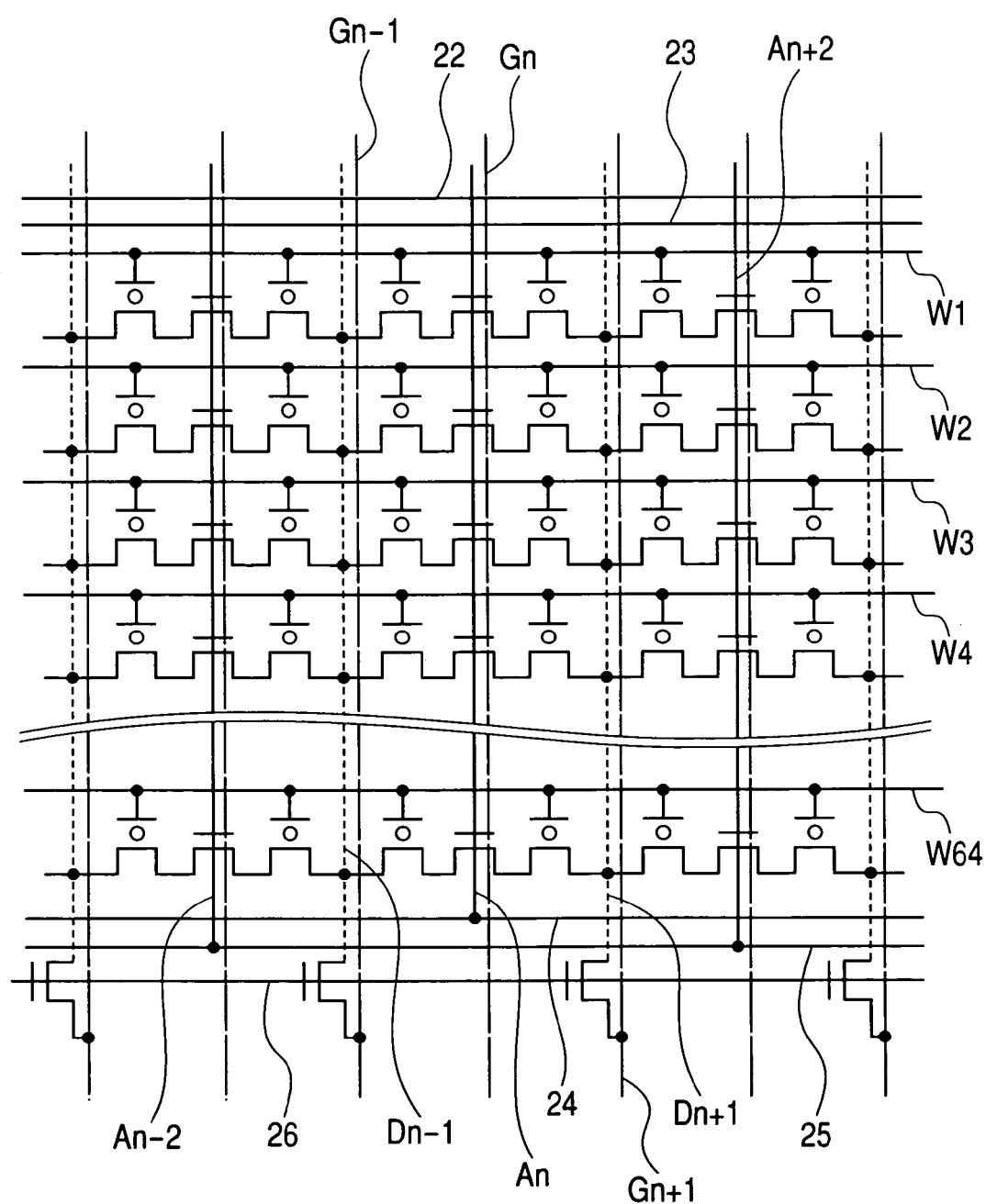
FIG. 23 is a circuit diagram of an equivalent circuit when in writing information in the semiconductor memory device.
Figure 24:
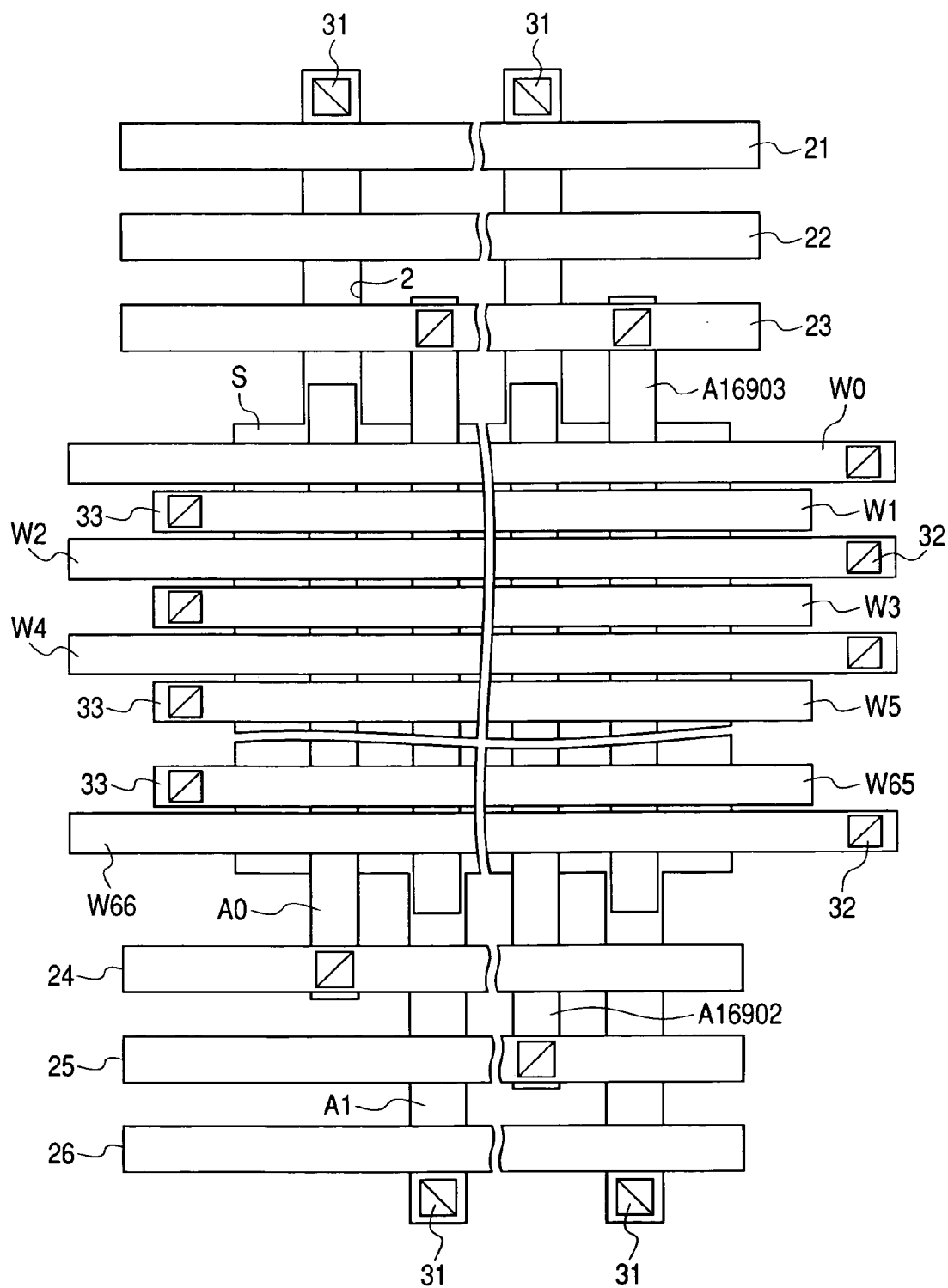
FIG. 24 is a schematic top view of a major portion of contact regions provided at both ends of a memory mat of a semiconductor memory device.

FIGS. 22–24 are further illustrative of an exemplary embodiment of the present invention. FIG. 22 is a cross sectional view of a major portion of a semiconductor substrate of a flash memory. FIG. 23 is a circuit diagram of an equivalent circuit during a writing operation, and FIG. 24 is a schematic top view of a major portion of contact regions provided at both ends of an X direction of a memory mat.

The flash memory in this exemplary embodiment differs in the method of writing operation. As previously described, writing may be done between two adjacent assist gates (An and An+1) and isolation may be done at the assist gates (An−1 and An−2) next to those electrodes (An and An+1). In this exemplary embodiment, however, writing may be done among an adjacent three assist gates (An−1, An, and An+1).

A positive voltage may be applied to each of the two assist gates (An−1 and An+1) of the three assist gates, which may be located at both ends (ex., 3.5 V to (An−1) and 7 V to (An+1) of the memory mat, to form inversion layers (Dn−1 and Dn+1) under those electrodes. These inversion layers (Dn−1 and Dn+1) may receive their power from a diffusion layer provided at an end of the memory mat. In this case, there is no need to set one (Dn−1) of the inversion layers at a high resistance.

If a high voltage Vww (15 V, for example) is applied to a word line (W4) as a writing pulse, the resistance may go low at every place except for the surface of the substrate 1 under the corresponding assist gate. If a potential difference exists between diffusion layers, an electrical field may be concentrated under the right end portion of the assist gate (An), thereby hot electrons may be generated there. Those hot electrons may be pulled toward the word line (W4), since the potential of the word line (W4) may be high, and may go over the potential barrier wall of the tunnel insulator (gate oxide film 5) to be injected in the charge storage region (enclosed by a circle (a) in FIG. 22). When writing information in the left side charge storage region (enclosed by a circle (b) in FIG. 22) of the center assist gate (An), it may be required to replace the set voltage of the assist gates at both sides (An−1 and An+1) with the set voltage of the inversion layers (Dn−1 and Dn+1) at both ends. Writing may also be possible by using any of the assist gates (An−1 and An+1) used as the assist gates at both ends in the above writing operation as a center assist gate. If the assist gate (An−1) is used as a center one, writing may be done in its right side region (enclosed by a circle (c) in FIG. 22). If the assist gate (An+1) is used as a center one, writing may be done in its left side region (enclosed by a circle (d) in FIG. 22). As a result, information may be stored in two places between adjacent assist gates (ex., An and An+1, as well as An−1 and An) as described previously.

In such a writing operation, a low potential inversion layer (Dn in the earlier exemplary embodiment and Dn−1 in the current embodiment) may be set at a high resistance, and an electrical field may be concentrated at an end portion. Therefore, the resistance value of the inversion layer (local data line D) may change significantly depending on the position of the subject word line W in the memory mat. In this exemplary embodiment, therefore, the center assist gate may form a high resistance region, so that such a position dependency may be eased. In other words, this exemplary embodiment may effectively reduce the writing variation among memory cells more.

In this exemplary embodiment, erasing may be done as previously described. Also, reading may be done from between inversion layers formed by adjacent assist gates differently from the writing done in units of three assist gates. The equivalent circuit used at that time may be that shown in FIG. 5. The sensing method may be the same as that described earlier. In this exemplary embodiment, dummy memory cells may be prepared and three level threshold values may be set in those dummy memory cells. Sensing in the reading method may be done as a differential operation from the target memory cell. The threshold value may be set between adjacent levels of the four level threshold values denoting the memory cell states. The method makes it possible to reduce the time between applying a reading pulse to a target word line W and starting of a sense amplifier. The reading speed may thus be increased. While the method employed in an earlier embodiment may be effective to eliminate the apprehension of the variation of writing characteristic among the dummy memory cells, the reliability of the flash memory in the earlier embodiment may be improved.

Figure 25:
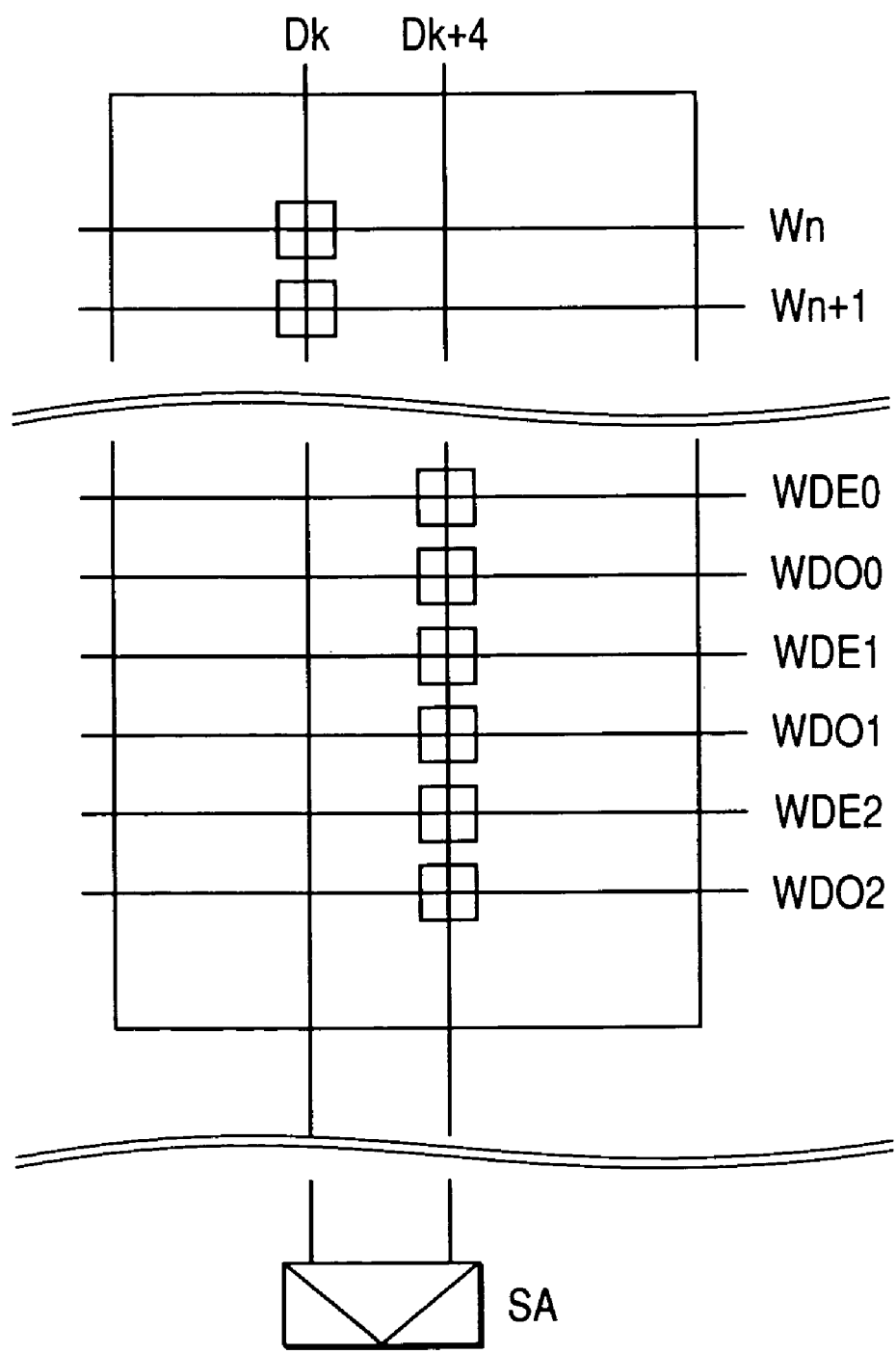
FIG. 25 is a schematic chart for describing a relationship between dummy cells and word lines in the semiconductor memory device.

Also, as shown in FIG. 25, the dummy memory cells may be divided into those for even numbered word lines and those for odd-numbered word lines. The word lines (WDE0, WDE1, and WDE2) of the dummy memory cells for even numbered word lines may be formed concurrently with the even numbered word lines, and both laminated structure and contact disposition may be the same among them. The word lines (WDO0, WDO1, and WDO2) of the dummy memory cells for odd-numbered word lines are also formed concurrently with the odd-numbered word lines, so that both laminated structure and contact disposition may be the same among them. Consequently, the flash memory in this second embodiment may compensate characteristic differences to be caused by processes.

A sense amplifier that makes a differential operation between two data lines (Dk) and (Dk+4) with three data lines therebetween may be used in this embodiment. This may be because the assist gates may operate in units of 4. Therefore, data line numbers separated from each another by an integer multiple of the number of data lines assumed as controlled may preferably be paired to make it easier to control them. If assist gates may be controlled in units of two just like in other embodiments described herein, data line numbers separated from each other by an integer multiple of 2 may be paired.

In this embodiment, the layout and manufacturing method of contacts may be different from those in the first embodiment. As shown in FIG. 24, odd numbered word lines may be short and contact holes 32 may be used for even numbered word lines. These may be provided so as to avoid adjacent word lines so that no short-circuit may occur between any contact hole 32 and its adjacent odd numbered word lines, even upon alignment error occurrence. Odd numbered word lines may be formed shorter than even numbered word lines at their one ends, and longer at the other ends. In this embodiment, however, odd numbered word lines may be all shorter than even numbered word lines at both ends.

Also, around the contact hole 33 of each odd-numbered word line may exist its adjacent even numbered word lines. Short-circuiting may thus be prevented between them, even at alignment error occurrence, if a large selection ratio is assumed between the silicon nitride film and the silicon oxide film in the etching process for forming the contact holes 33. This may be because even numbered word lines may be protected by the cap insulator 6 consisting of a silicon nitride film. Such a short-circuiting may also be prevented by limiting the over-etching only up to the thickness of the cap insulator and under. In that connection, contact holes 32 of even numbered word lines and contact holes 33 of odd numbered word lines may be formed in different processes.

Some of the contact holes 32 of even numbered word lines, as described in the exemplary embodiments, may be shifted from their word lines so as to cover space regions. (This method may be referred to as the side face contact forming method.) As described above, if a large selection ratio is assumed between the silicon nitride film and the silicon oxide film in the etching process for forming contact holes, the top face of each even numbered word line may be covered by the silicon nitride film (cap insulator 6), so that they are not connected electrically with each other even when holes may have been formed from above. If the side face contact forming method as described above is employed, contact holes of both even numbered and odd numbered word lines may be formed concurrently.

The contact forming method in other embodiments may be employed, or any of the contact forming methods to be described in the subsequent embodiments may be employed. The contact forming method in the earlier embodiments require no silicon nitride film (cap insulator 6) when forming contact holes. After processing word lines, therefore, the cap insulator 6 may be removed and the top face of each word line may be subject to a silicidation process (to lower the resistance) so as to speed up the operation. On the other hand, the contact hole forming method in this embodiment may require no wide portion (dog bone part) at the places where contact holes 33 may be formed for odd numbered word lines, so that no fine mask pattern may be required in the process for forming the odd-numbered word lines. Consequently, the process margin may be secured more and the manufacturing cost of photo masks may be reduced.

Figure 26:
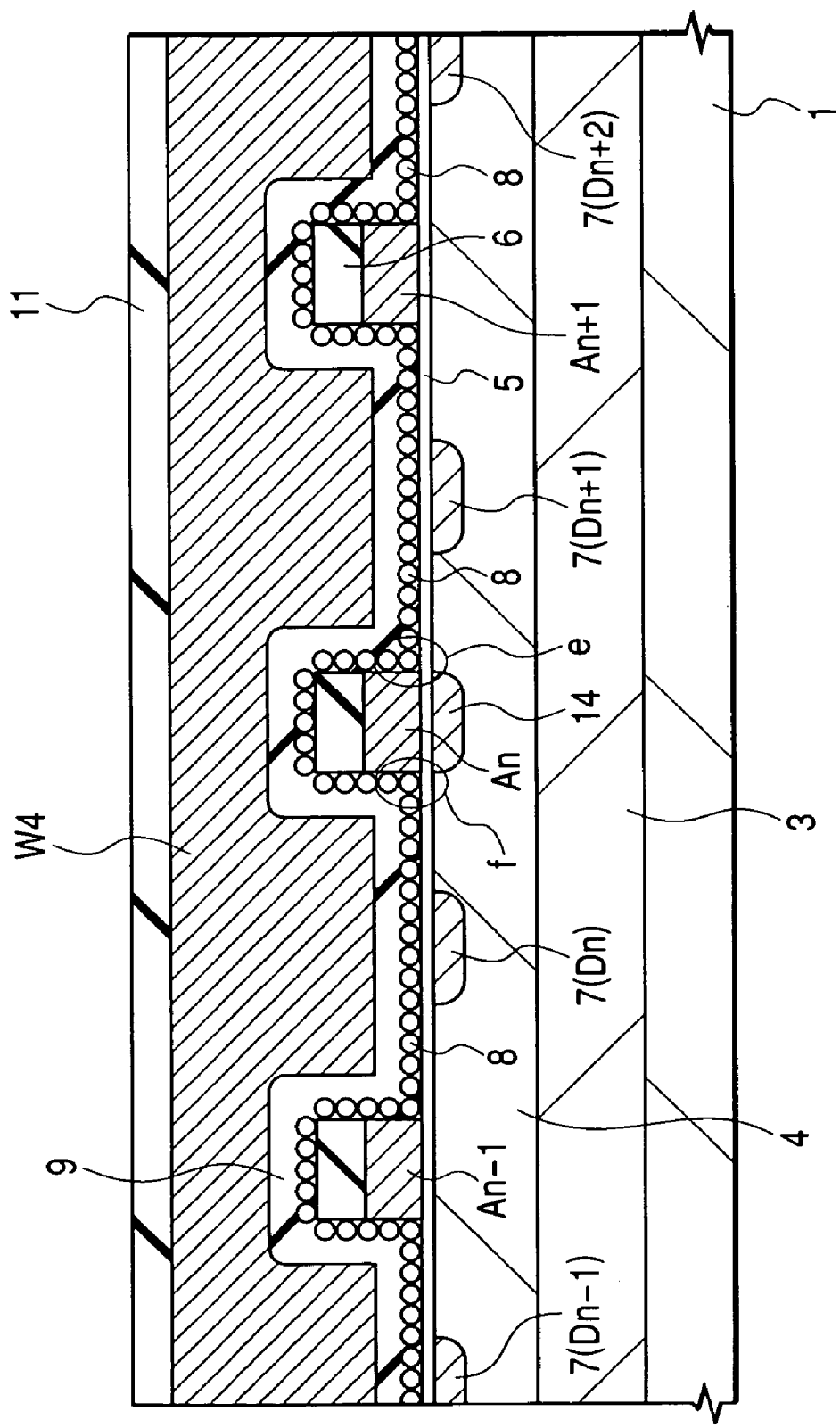
FIG. 26 is a cross sectional view of a major portion of a semiconductor substrate of the semiconductor memory device.
Figure 27:
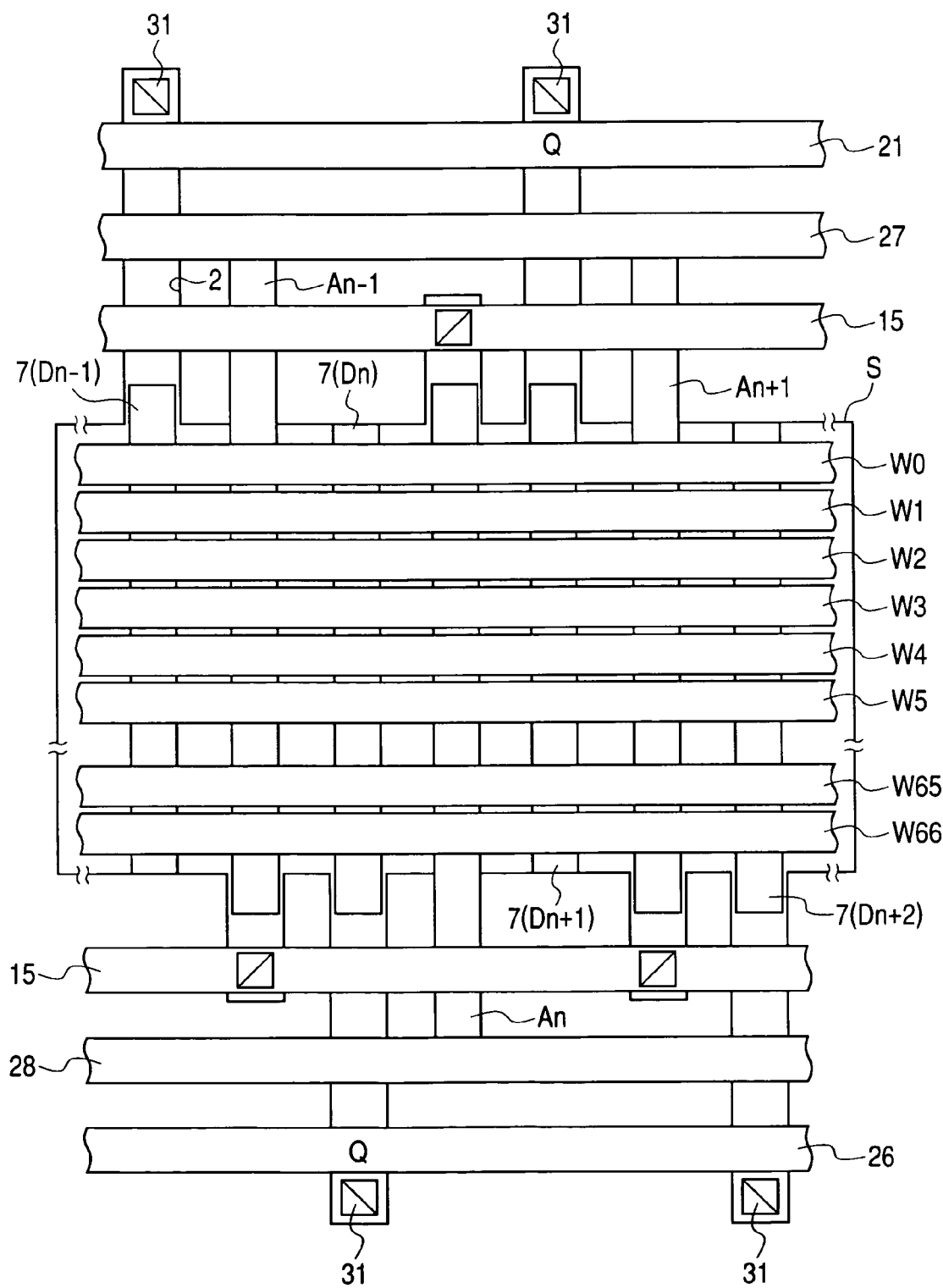
FIG. 27 is a schematic top view of a major portion of the memory mat of the semiconductor memory device.
Figure 28:
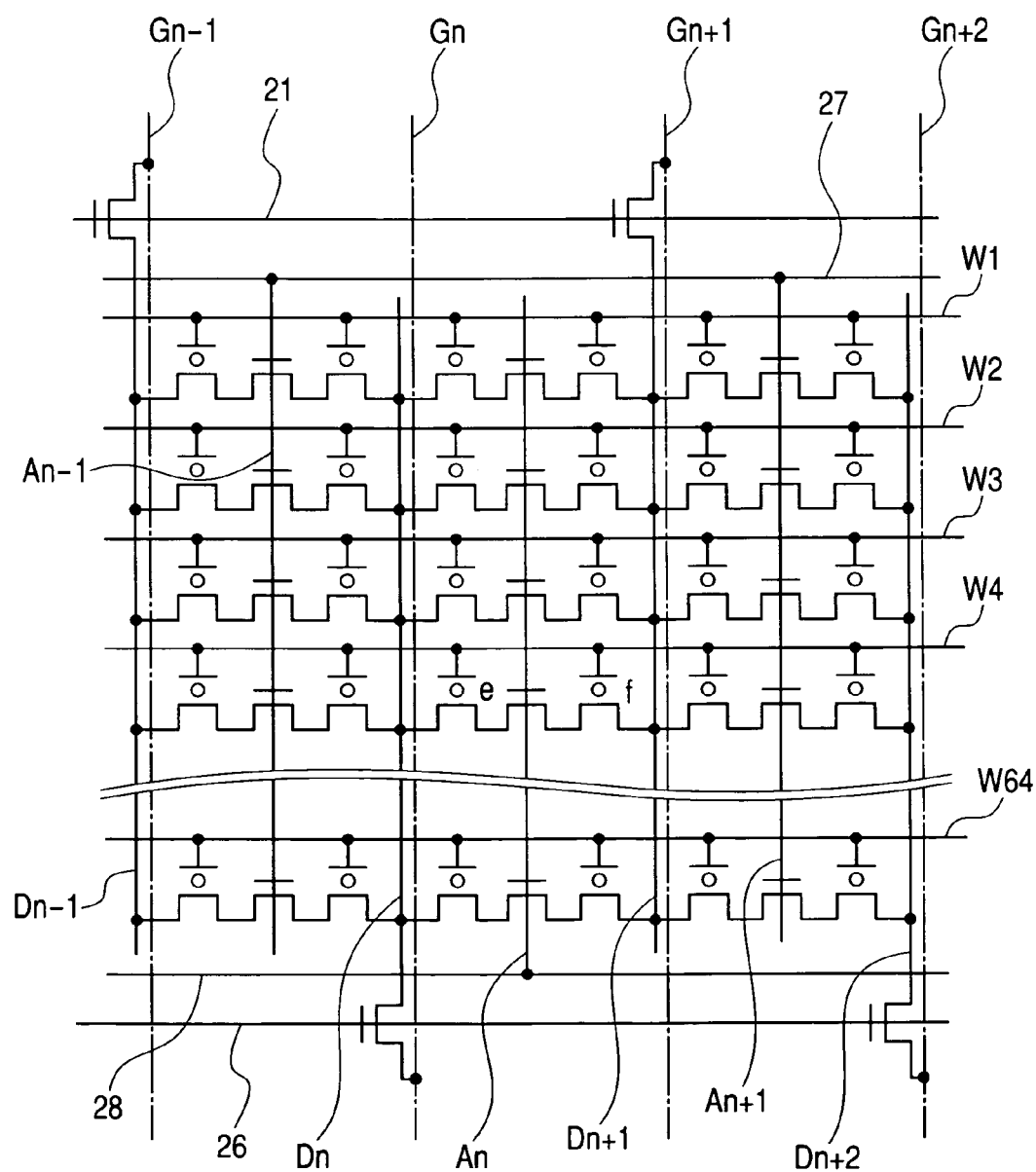
FIG. 28 is a circuit diagram of the equivalent circuit when in writing information in the semiconductor memory device.
Figure 29:
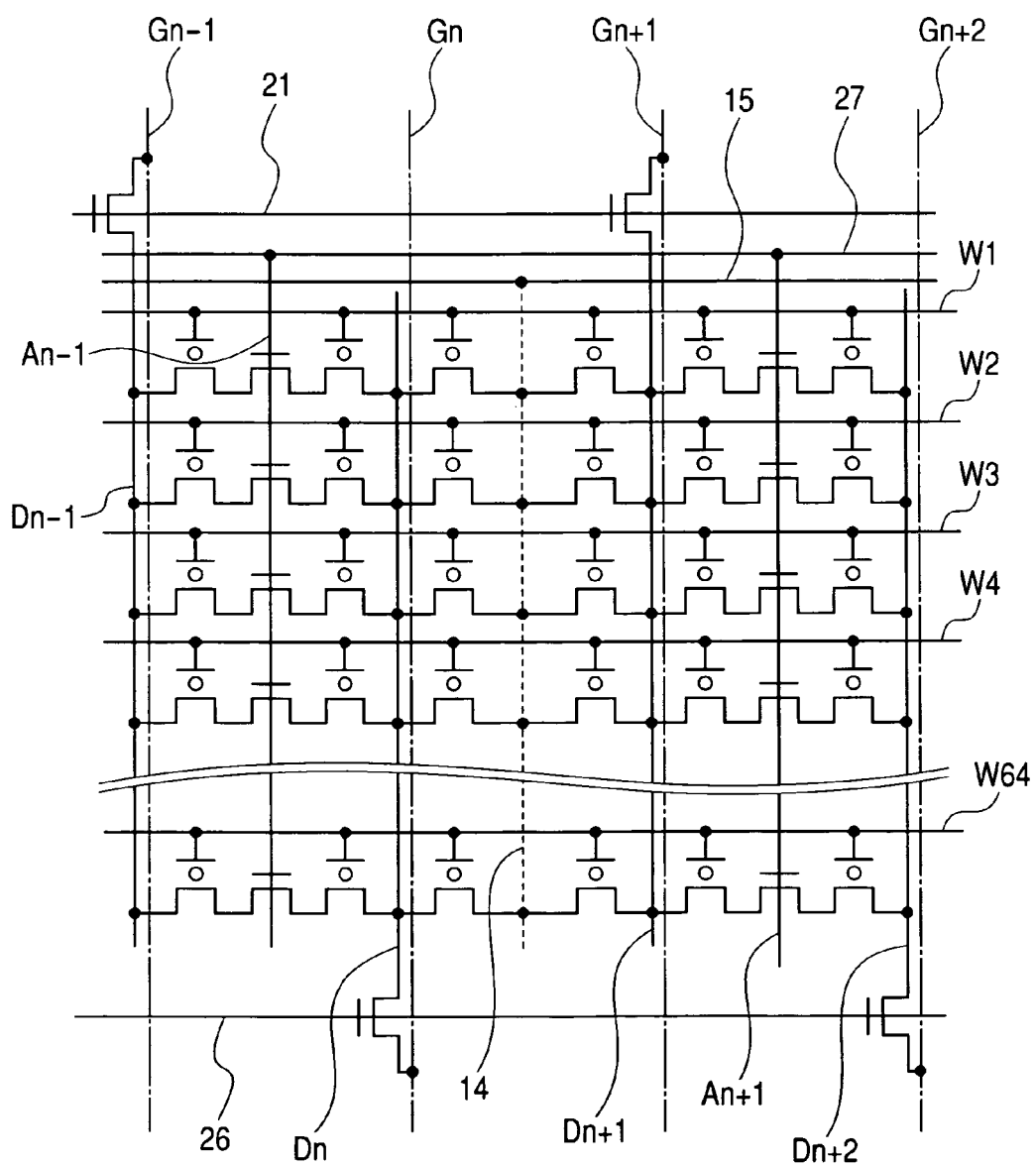
FIG. 29 is a circuit diagram of the equivalent circuit when in writing information in the semiconductor memory device.

As can been seen in FIGS. 26–29, yet another exemplary embodiment is illustrated. FIG. 26 shows a cross sectional view of a major portion of a semiconductor substrate of the flash memory. FIG. 27 shows a schematic top view of a memory mat. FIG. 28 is a circuit diagram of an equivalent circuit during a writing operation. FIG. 29 is a circuit diagram of the equivalent circuit during a reading operation.

In other embodiments of the present invention, a voltage may be applied to each assist gate A to form a inversion layer to be used as a local data line. In this embodiment, however, impurity ions may be injected at a high density in each p-type well 4 to form a diffusion layer 7 to be used as a local data line.

Writing in this embodiment may be similar to that in other embodiments described herein. In the case of writing, it may be required to make the local data lines (Dn−1 and Dn+1) in an earlier embodiment correspond to the local data lines (Dn and Dn+1) in this exemplary embodiment. In other words, just like writing of information in the right side region (a) of the assist gate An, information may be written in the right side region (e) of the assist gate An, and just like writing of information in the left side region (b) of the assist gate An, information may be written in the left side region (f) of the assist gate An in this exemplary embodiment. In the structure of the flash memory, the resistance of each local data line D when in writing may be lower than previously described, thereby reducing the variation of writing characteristic among memory cells, which may depend on the place of each target memory cell in the memory mat.

On the other hand, when in reading, a voltage may be applied to a target assist gate (An) to form a inversion layer 14. This inversion layer 14 may be set at a fixed voltage Vs (0 V, for example) through the source line 15. As a result, when in reading, information may be read from both right and left sides of the assist gate independently. Also, because word lines W may be disposed at narrow pitches, the resistance of the inversion layer 14 may be reduced when in reading, thereby reducing the variation of reading characteristic among memory cells, which may depend on the position of each subject memory cell in the memory mat just like in the first and second embodiments. However, while each inversion layer (local data line) may be used in both writing and reading in the first and second embodiments, the inversion layer (local data line) may be used only for reading in this exemplary embodiment.

Figure 30:
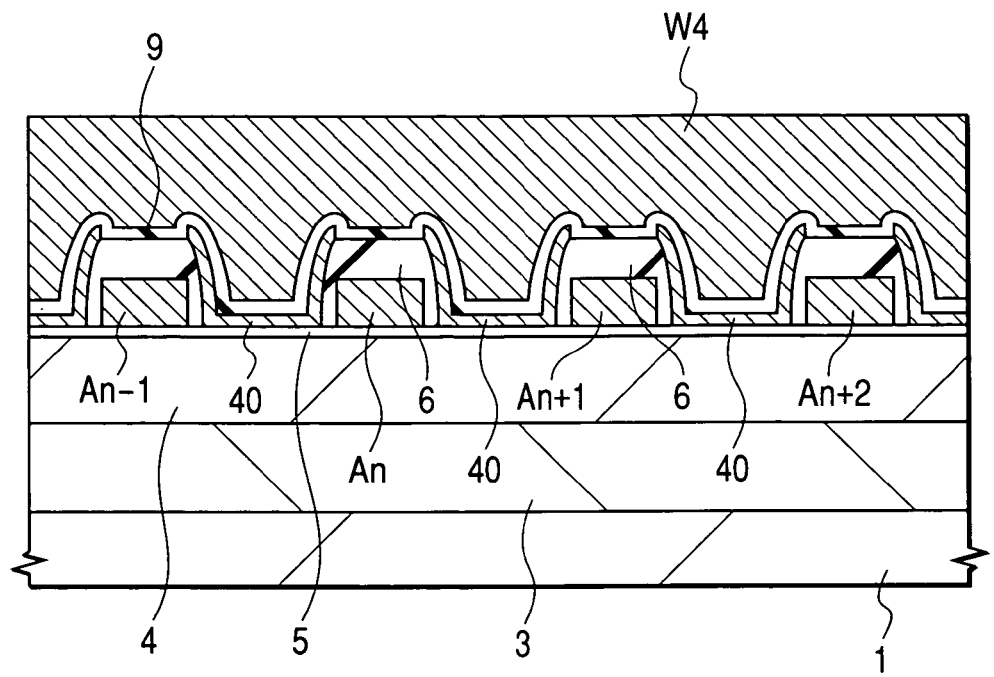
FIG. 30 is a cross sectional view of a major portion of the semiconductor substrate of the semiconductor memory device.
Figure 31:
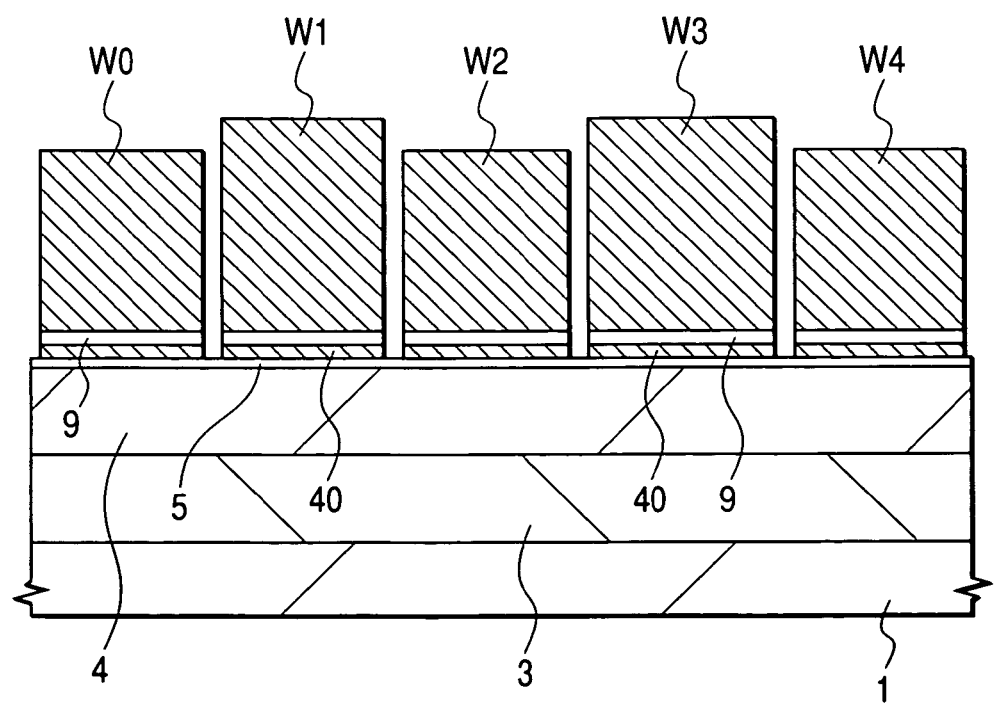
FIG. 31 is another cross sectional view of the major portion of the semiconductor substrate of the semiconductor memory device.

As shown in FIG. 27, in the configuration of the flash memory, only one type voltage Vs may be required to be supplied to each inversion layer formed by a control electrode (word line W). The voltage Vs may be common for all the assist gates. However, source lines 14 and 15 may be disposed at the upper and lower ends of a memory mat. Consequently, the inversion layer manufacturing may be easier than in previously described embodiments in which a inversion layer leading-out structure may be required to be formed for each assist gate A. In addition, because there may be no special operation required for forming inversion layers when in writing, assist gates A may be controlled easily and the control lines 27 and 28 for the assist gates A may be required as one at each of the top and bottom of a memory mat. The area of the memory mat may thus be reduced. Yet another exemplary embodiment is illustrated in FIGS. 30 and 31. FIG. 30 is a cross sectional view of a major portion of a semiconductor substrate of a flash memory (along the cross sectional direction of the assist gates). FIG. 31 is a cross sectional view of a major portion of the semiconductor substrate just after word lines W are formed (along the cross sectional direction of the word lines).

The flash memory may be similar to that in other previously described embodiments with respect to the array configuration and the operation. However, each charge storage region in the flash memory in this embodiment may consist of a polycrystalline silicon film 40. This may be a difference from previously described embodiments.

If a continuous polycrystalline silicon film 40 is used to form a solid structure, an area in which word lines W face charge storage regions may be larger, so that a voltage applied to each word line W may also be applied to the tunnel insulator (gate oxide film 5) between each charge storage region and the substrate 1 effectively, thereby writing/erasing speed may be increased and the reading current increased. In order to realize the structure of the flash memory, however, this embodiment may require a manufacturing process that may not be provided in any of the other embodiments. Hereinafter, the manufacturing process provided for this particular embodiment will be described briefly.

The processes up to the forming of assist gates A and the tunnel insulator (gate oxide film 5) may be the same as those in other embodiments. After that, an n-type doped polycrystalline silicon film 40 of about 25 nm in thickness may be deposited, then may be coated by a photo-resist film, then may be subjected to an etching-back process to remove the photo-resist film from the upper part of each assist gate A. Then, the polycrystalline silicon film 40 in the upper part of each assist gate A may be removed by etching and the photo-resist film may be removed to form each charge storage region consisting of a polycrystalline silicon film 40 on the side wall of each assist gate and in the space region.

Next, an interlayer insulator 9 may be formed. The insulator 9 may consist of a silicon oxide film of about 15 nm in thickness. After that, an n-type doped polycrystalline silicon film may be deposited on the interlayer insulator 9 and the surface may be flattened by the CMP method, and then a silicon oxide film may be formed in the upper portion thereof. After that, both of the silicon oxide film and the polycrystalline silicon film may be etched using the photoresist film as a mask to form even numbered word lines W (W0, W2, W4, . . . , W66).

Next, an insulator of about 20 nm may be formed at both top face and side face of each word line W in a thermal oxidation process, then an n-type doped polycrystalline silicon film may be deposited and flattened. After that, the polycrystalline silicon film on even numbered word lines W (W0, W2, W4, . . . , W66) may be removed to form odd-numbered word lines W (W1, W3, W5, . . . , W65). Then, the silicon oxide film may be etched by anisotropic dry-etching. If a slower etching rate of the polycrystalline silicon is selected at that time, the silicon oxide film that separates even numbered word lines W from odd-numbered word lines W may be removed and the etching stops on the surface of the polycrystalline silicon film 40 of the charge storage region. After that, the polycrystalline silicon film 40 between even numbered word lines W and odd-numbered word lines W may be etched to form charge storage regions with use of word lines W and the self-alignment action. The subsequent processes are the same as those in the other embodiments.

Figure 32:
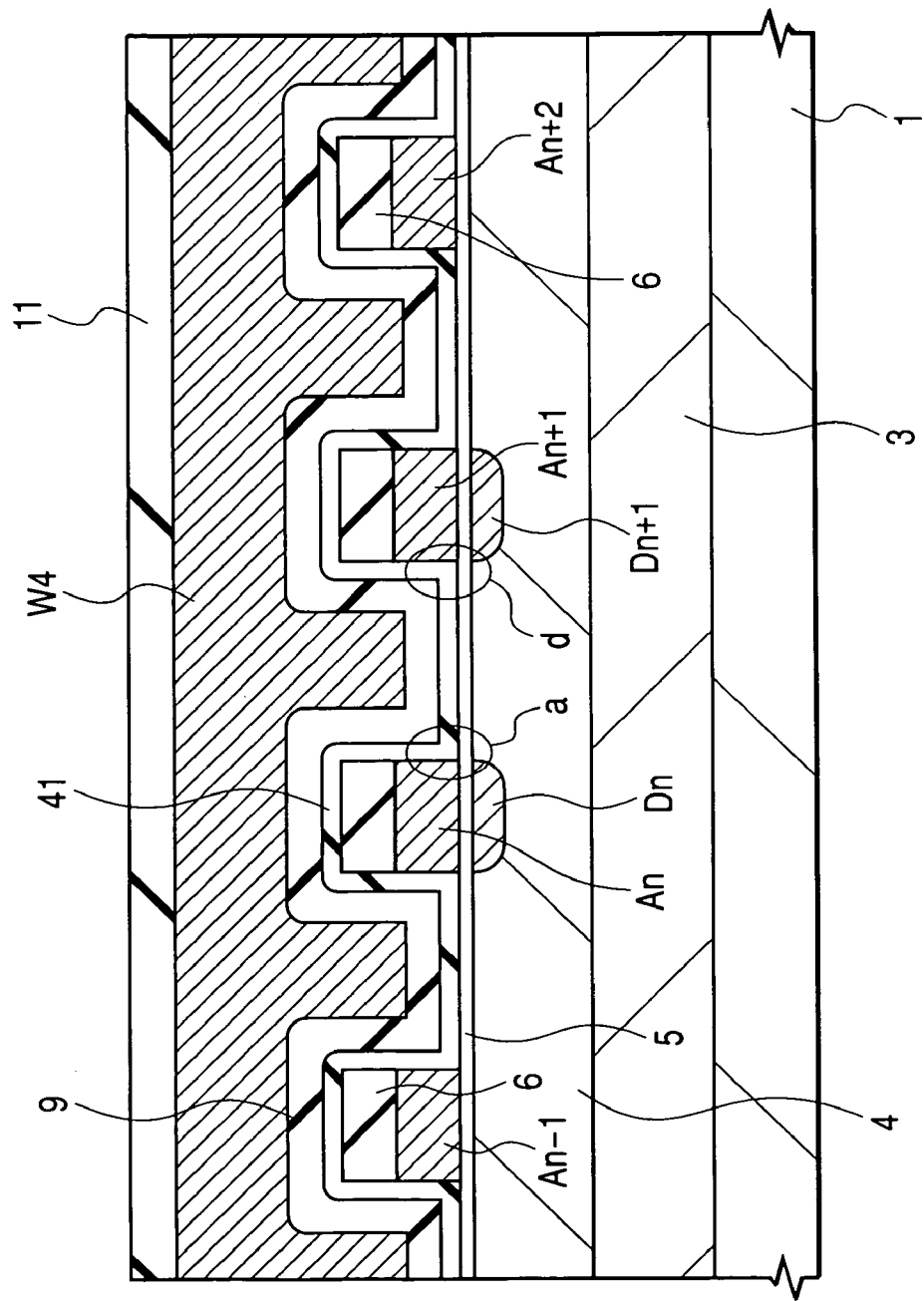
FIG. 32 is still another cross sectional view of the major portion of the semiconductor substrate of the semiconductor memory device.

FIG. 32 shows a cross sectional view of a major portion of a semiconductor substrate of a flash memory in yet another exemplary embodiment (along the cross sectional direction of assist gates). The flash memory may be characterized in that each charge storage region may be configured by a continuous silicon nitride film 41 of about 30 nm in thickness. The silicon nitride film 41 may have a charge trapping function, so that it may be used as charge storage regions even when it may be formed as an insulator. Instead of the silicon nitride film 41, an alumina film may be used as an insulator having a charge trapping function.

If such each charge storage region is configured as an insulator, it may keep the non-volatile property even when the tunnel insulator/interlayer insulator 9 is reduced in thickness. The tunnel insulator may be configured by, for example, a gate oxide film 5 of about 1.5 nm in thickness and the interlayer insulator 9 may be configured by a silicon oxide film of about 2 nm in thickness.

The flash memory may also be characterized by the locations of the charge storage regions. In addition to the charge storage regions enclosed by a circle (a) in FIG. 32, respectively, each of the charge storage regions (enclosed by a circle (d) in FIG. 32) of its adjacent assist gate (An+1) may be used as a charge storage region of the assist gate (An). Also, while the flash memory in the first embodiment may adjust the charge to be stored in one charge storage region to set 4 level threshold values and store 2-bit information, the flash memory may store 2-bit information in two charge storage regions. In this exemplary embodiment, a 2-level threshold value may be set in each of the two charge storage regions to store single-bit information.

This may be because a threshold value may be apt to be varied slightly if such an insulator having a charge trapping function may be used as the silicon nitride film 41 and an alumina film may be used for charge storage regions, so that it may be recommended to store single bit information in one charge storage region. Also, if an insulator having a charge trapping function is used for charge storage regions, the charge trapping may be done easily at a high density, so that a charge amount may be secured even when charge electrons may be injected in a narrow region. The flash memory operation may be thus stabilized, so that this method may be suitable for the flash memory as described.

Because the charge storage regions may be located differently from those in other embodiments, some operations of the region may also differ from those previously described. When writing information in the charge storage region (a) close to the assist gate (An), the writing may be done similarly to that in other embodiments. When writing information in the charge storage region (d) at the side of the assist gate (An+1), however, the functions of the two assist gates (An and An+1) may be exchanged. At that time, the global data line Gn may be replaced with another Gn+1 for loading data.

Such a functional exchange may also be done for reading information. The voltage of the reading drain at that time, that is, the voltage Vd to be applied to the inverted layer, may be set so as to satisfy a relationship of VWr−Vth1<Vd when the low threshold value for storing information may be Vth1 in status and the reading voltage to be applied to the object word line W may be VWr. Consequently, the information in the drain side charge storage region used for a pinch-off event may be blocked at the drain side, so that only the source side information may be read. For example, when reading information from a charge storage region close to the assist gate (An), 0 V may be set as the voltage of the inverted layer (local data line Dn) formed by the assist gate (An) and 2 V may be set as the voltage of the inverted layer (local data line Dn+1) formed by the assist gate (An+1). When reading information from the charge storage region (d) close to the assist gate (An+1), 0 V may be set as the voltage of the inverted layer (local data line Dn+1) and 2 V may be set as the voltage of the inverted layer (local data line Dn), respectively.

Erasing may be done in this embodiment as previously described. However, it may also be possible to erase information by generating a pair of electron holes at the substrate side, then applying a negative voltage to the object word line W to inject holes therein. The hole injection erasing method may be characterized in that it requires a comparatively low voltage to be applied to erase information fast.

While the forms of the present invention has been described in detail, it is to be understood that modifications will be apparent to those skilled in the art without departing from the spirit of the invention.

According to the present invention, in a non-volatile semiconductor memory device that uses each inverted layer formed on the surface of the semiconductor substrate as a data line, it may be possible to achieve both a reduction of the variation of the writing/reading characteristics among memory cells and reduction of the bit cost.

The invention claimed is:

1. A semiconductor memory device, comprising:
   at least one assist gate formed through a first insulator on a main surface of a first conductive type semiconductor substrate and extended in a first direction of said main surface;
   a plurality of word lines formed on said assist gates through a second insulator and extended in a second direction that is substantially perpendicular to said first direction; and
   a plurality of memory cells disposed at nodes of respective ones of said assist gates and said plurality of word lines,
   wherein said memory device has a memory array structure in which a second conductive type inversion layer is formed electrically on a surface of said semiconductor substrate located in the lower part of said assist gates, wherein said inversion layer comprises a wiring for connection between adjacent ones of said plurality of memory cells when a voltage is applied to said assist gates, wherein adjacent ones of said plurality of word lines are separated electrically from each other by a side wall spacer, wherein said side wall spacer comprises an insulator formed at sides at least one of even-numbered and odd-numbered ones of said plurality of word lines, and wherein the space between adjacent ones of said plurality of word lines is less than or about equal to ½ of a width of said word lines.

2. The semiconductor memory device according to claim 1, wherein a top face of each of the even-numbered or odd-numbered word lines having said side wall spacer, is covered by a third insulator, and wherein a height of the top face of each of said word lines not having said side wall spacer is substantially equivalent to that of a top face of said third insulator.

3. The semiconductor memory device according to claim 1, wherein said plurality of word lines are divided into groups, each of which comprises first to fourth word lines disposed repetitively, wherein ends of said first to fourth word lines are arranged having said first word line longer than said second word line, said third word line longer than said second word line, and said fourth word line longer than said third word line, wherein a first contact hole for applying a voltage to said third word line is formed on said one end of said third word line, wherein a second contact hole for applying a voltage to said fourth word line is formed on said one end of said fourth word line, wherein other ends of said first to fourth word lines are arranged having said second word line longer than said first word line, said second word line longer than said third word line, and said third word line longer than said fourth word line, wherein a third contact hole for applying a voltage to said first word line is formed on an other end of said first word line, and wherein a fourth contact hole for applying a voltage to said second word line is formed on an other end of said second word line.

4. The semiconductor memory device according to claim 1, wherein said plurality of word lines are formed having a set of said first to fourth word lines adjacent to each other, wherein one end of said first to fourth word lines is arranged having said first word line longer than said second word line, said third word line longer than said second word line, and said third word line longer than said fourth word line, wherein a third contact hole for applying a voltage to said first word line is formed on one end of said first word line, wherein a first contact hole for applying a voltage to said third word line is formed on one end of said third word line, wherein an other end of said first to fourth word lines is arranged having said first word line longer than said second word line, said third word line longer than said second word line, and said third word line longer than said fourth word line, wherein a fourth contact hole for applying a voltage to said second word line is formed on the other end of said second word line, and wherein a second contact hole for applying a voltage to said fourth word line is formed on the other end of said fourth word line.

5. The semiconductor memory device according to claim 1, wherein each of said plurality of memory cells comprises charge storage means, wherein information is stored in each of the memory cells based on a value of a current flowing in said second conductor type inversion layer, wherein the current flowing changes according to an amount of charge stored in said charge storage means.

6. The semiconductor memory device according to claim 5, wherein said charge storage means comprises one selected from a plurality of semiconductor microcrystal grains and metallic microcrystal grains, insulated from each other through an insulator.

7. The semiconductor memory device according to claim 5, wherein said charge storage means is formed by an insulator having a charge trapping function.

8. The semiconductor memory device according to claim 1, wherein a voltage applied to said plurality of word lines or said assist gates changes according to a memory address of each of said plurality of word lines.

9. The semiconductor memory device according to claim 1, wherein each of said plurality of memory cells is a multi-bit storage memory cell.

* * * * *